(12) United States Patent
Huang et al.

(10) Patent No.: US 9,796,183 B2
(45) Date of Patent: Oct. 24, 2017

(54) MULTIFUNCTIONAL ELECTROHYDRODYNAMIC INKJET PRINTING DEVICE AND PRINTING METHOD USING THE SAME

(71) Applicant: Huazhong University of Science and Technology, Wuhan (CN)

(72) Inventors: Yongan Huang, Wuhan (CN); Zhouping Yin, Wuhan (CN); Ningbin Bu, Wuhan (CN); Jiankui Chen, Wuhan (CN); Yanqiao Pan, Wuhan (CN); Yajiang Ding, Wuhan (CN); Yongqing Duan, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 14/849,631

(22) Filed: Sep. 10, 2015

(65) Prior Publication Data
US 2016/0001550 A1    Jan. 7, 2016

Related U.S. Application Data

(63) Continuation-in-part of application No. PCT/CN2014/075804, filed on Apr. 21, 2014.

(30) Foreign Application Priority Data

Mar. 27, 2014 (CN) .......................... 2014 1 0118287

(51) Int. Cl.
B41J 2/145 (2006.01)
B41J 2/07 (2006.01)
(Continued)

(52) U.S. Cl.
CPC ............... *B41J 2/145* (2013.01); *B41J 2/072* (2013.01); *B41J 3/28* (2013.01); *B41J 3/407* (2013.01);
(Continued)

(58) Field of Classification Search
CPC ..... B41J 2/145; B41J 2/072; B41J 2/01; B41J 3/407; B41J 3/28; B41J 25/308; B41J 29/377; B41J 11/002; H01L 31/18
See application file for complete search history.

(56) References Cited

U.S. PATENT DOCUMENTS 5,838,349 A * 11/1998 Choi .................... B41J 2/04576
347/43
5,967,512 A * 10/1999 Irsik ....................... B65H 5/062
226/177
(Continued)

FOREIGN PATENT DOCUMENTS

CN        203372884 U  *  1/2014
JP        2002234141 A  *  8/2002
JP        GB 2379414 A  *  3/2003  .............. B41J 3/407

*Primary Examiner* — Julian Huffman
*Assistant Examiner* — Michael Konczal
(74) *Attorney, Agent, or Firm* — Matthias Scholl, PC; Matthias Scholl

(57) ABSTRACT

An electrohydrodynamic inkjet printing device, including: a support part; a jet printing module; a substrate bearing and moving module; and a roll-to-roll thin film conveying module. The jet printing module is disposed on the support part and includes a nozzle for ejecting printing fluid onto a substrate for pattern printing. The substrate bearing and moving module is disposed on the support part, and fixedly bears a rigid substrate as the substrate for pattern printing, and drives the rigid substrate to move with respect to the jet printing module. The roll-to-roll thin film conveying module is disposed on the support part, and transfers a flexible thin
(Continued)

film as the substrate for pattern printing, and drives the flexible film to move with respect to the jet printing module.

12 Claims, 17 Drawing Sheets

(51) Int. Cl.
*B41J 3/28* (2006.01)
*B41J 3/407* (2006.01)
*B41J 25/308* (2006.01)
*H01L 31/0224* (2006.01)

(52) U.S. Cl.
CPC .... *B41J 25/308* (2013.01); *H01L 31/022425* (2013.01); *Y02E 10/50* (2013.01)

(56) References Cited

U.S. PATENT DOCUMENTS

| | | | | |
|---|---|---|---|---|
| 7,794,613 | B2 * | 9/2010 | McAvoy | B41J 2/14 216/27 |
| 8,562,095 | B2 * | 10/2013 | Alleyne | B41J 2/06 347/14 |
| 2003/0210313 | A1 * | 11/2003 | Nedblake, Jr. | B23K 26/0846 347/102 |
| 2010/0005987 | A1 * | 1/2010 | Shapira | B41J 11/14 101/407.1 |
| 2012/0244291 | A1 * | 9/2012 | Bisht | D01D 5/0092 427/458 |

* cited by examiner

MULTIFUNCTIONAL ELECTROHYDRODYNAMIC INKJET PRINTING DEVICE AND PRINTING METHOD USING THE SAME

CROSS-REFERENCE TO RELATED APPLICATIONS

This application is a continuation-in-part of International Patent Application No. PCT/CN2014/075804 with an international filing date of Apr. 21, 2014, designating the United States, now pending, and further claims priority benefits to Chinese Patent Application No. 201410118287.8 filed Mar. 27, 2014. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to an inkjet printing system, and more particularly to a multifunctional electrohydrodynamic inkjet printing device and a printing method using the same.

Description of the Related Art

Conventional inkjet printing technologies have the following defects: (1) the resolution of jet printing is low, and the size of a droplet is limited by the diameter of a nozzle; (2) high viscosity solution tends to block the nozzle; (3) the manufacturing process of the nozzle is complex; (4) the printing efficiency of a large-area film and microstructure is low; and (5) the printing mode is single, so that it is impossible to produce a point-like structure, a line-like structure, or a film-like structure as may be needed.

SUMMARY OF THE INVENTION

In view of the above-mentioned problems, it is an objective of the invention to provide a multifunctional electrohydrodynamic inkjet printing device capable of achieving jet printing of a micron/submicron point-like structure, direct writing of a micron/submicron line-like structure, and spraying of a nano film by an electrohydrodynamic technology using sheet processing and roll-to-roll processing.

To achieve the above objective, according to one embodiment of the invention, there is provided a multifunctional electrohydrodynamic inkjet printing device, comprising: a support part; a jet printing module fixed on the support part and comprising a nozzle for ejecting printing fluid onto a substrate for pattern printing; a substrate bearing and moving module disposed on the support part, and operating to fixedly bear a rigid substrate as the substrate for pattern printing, and to drive the rigid substrate to move with respect to the jet printing module thereby enabling pattern printing on the rigid substrate; and a roll-to-roll thin film conveying module disposed on the support part, and operating to transfer a flexible thin film as the substrate for pattern printing, and to drive the flexible film to move with respect to the jet printing module thereby enabling pattern printing on the flexible film.

The jet printing of various components and patterns is achieved by controlling a distance between the nozzle and the substrate, printing fluid flow and/or voltage applied between the nozzle and the substrate thereby generating one or more jet printing modes comprising on-demand inkjet of a single droplet, spraying of atomized droplets, and direct writing of continuous jet, and by using different substrates for pattern printing.

In a class of this embodiment, the jet printing module comprises: a base fixed on the support part; a first directional motion module group fixed on the base, and adapted to move in first direction with respect to the base; a second directional motion module group disposed on the first directional motion module group via a first directional connecting plate on the first directional motion module group, and adapted to move in second direction with respect to the first directional motion module group; and a third directional motion module group disposed on the second directional motion module group via a second directional connecting plate on the second directional motion module group, and adapted to move in third direction with respect to the second directional motion module group, an injection pump and the nozzle being disposed thereon.

In a class of this embodiment, the substrate bearing and moving module comprises: a substrate base fixed on the support part; a first directional motion module fixed on the substrate base, and adapted to move in the first direction with respect thereto; a second directional motion module disposed on the first motion module via a movable connecting plate fixed on the first motion module, and adapted to move in the second direction with respect to the first directional motion module; and an absorption platform disposed on the second directional motion module via a slider connecting plate fixed on the second directional motion module, adapted to move synchronously therewith, and operating to absorb the rigid substrate as the substrate for pattern printing.

In a class of this embodiment, the roll-to-roll thin film conveying module comprises an unwinding part and a winding part, the unwinding part comprises an unwinding plate, and an unwinding roller and a nip roller disposed on the unwinding plate, the film substrate released by the unwinding roller passes through the center of the nip roller and is then output, the winding part comprises a winding plate, and an absorption roller, a dance roller and a winding roller disposed on the winding plate, the film substrate transferred via the unwinding part is absorbed and pressed tightly by the absorption roller, and then transferred to the winding roller for film collecting, the dance roller being disposed between the absorption roller and the winding roller and operating to tightly stretch the film substrate.

In a class of this embodiment, the unwinding roller comprises a magnetic particle brake connection plate, a magnetic particle brake, a coupling, a bearing support, an inflatable shaft, and a material roll, the magnetic particle brake connection plate is operating to fix the magnetic particle brake and is fixedly connected to the unwinding plate, one side thereof is fixedly connected to an end of the magnetic particle brake connection plate, the magnetic particle brake is received in a connecting hole of the coupling, an optical axis of the inflatable shaft passes through a bearing hole in the bearing support fixed on the unwinding plate, and is connected to one end of the coupling; and the material roll in a tension state is wounded on the expansion end of the inflatable shaft, and outputs the film substrate in synchronization with the flatulence axis under the drive thereof.

In a class of this embodiment, the nip roller comprises an upper roller and a lower roller parallel to each other, an end of the upper roller and that of the lower roller are supported by a pair of nip roller support plates symmetrically and vertically fixed on the unwinding plate, a notch is disposed on an upper end of the nip roller support plate and operates to receive a cylinder, the upper roller is connected to a cylinder piston, and operates to adjust the gap between the upper roller and the lower roller, one end of the lower roller is connected to a rotating shaft of a motor, and the motor drives the lower roller to rotate thereby outputting the film substrate between the upper roller and the lower roller.

In a class of this embodiment, the winding roller comprises a winding roller motor supported by a roller motor support part disposed on the winding plate, a motor shaft of the winding roller motor is connected to an end of a clutch, an optical axis of the inflatable shaft passes through the bearing hole in the bearing support fixed on the winding plate, and is received in one hole on the other end of the coupling, the winding roller is fit on the inflatable shaft, and operates to force a film to collect materials under the drive of the winding roller motor.

In a class of this embodiment, the winding roller further comprises: a clutch support plate fixedly fixed on the winding plate and operating to receive a magnetic powder clutch thereby ensuring winding tension is constant during winding and the material roll is tight enough; and another coupling, the motor shaft of the winding roller motor passing through the coupling and being flexibly connected to one end of the magnetic powder clutch, and the other end of the magnetic powder clutch being connected to an end of the clutch.

In a class of this embodiment, the dance roller comprises: a roller mounting plate vertically connected to the winding plate via an angle brace; an idler roller and a frictional cylinder driving the idler roller to move, the idler roller being connected to the roller mounting plate via a first adapter plate, the idler roller comprising a flange base connected to the first adapter plate, a idler roller axis disposed on the flange base, and a roller wheel fit on the idler roller axis, two ends of the roller wheel being fit with bearing pipes and encapsulated by bearing covers.

In a class of this embodiment, the absorption roller comprises an absorption roller axis, a sleeve fit on the absorption roller axis, an absorption roller motor connected to an end of the absorption roller axis, the absorption roller axis is a step-shaped core shaft, an axial keyway is disposed on a periphery of the shaft in the axial direction, and a baffle is disposed in the keyway and between the absorption roller axis and the sleeve, an end of the absorption roller axis opposite to the absorption roller motor is fixed on a support plate via a shaft bearing, both ends thereof are closed by end covers of the absorption roller thereby forming an enclosed space; and absorption and feeding of the film is achieved by forming vacuum in the enclosed space, absorbing the film substrate on surface of the sleeve via holes on the sleeve and forcing the sleeve to rotate using the absorption roller motor.

In a class of this embodiment, the jet printing device further comprises a print observation module, comprising an observation part and a lighting part disposed on an end of the jet printing module opposite thereto, the observation part comprises a first adjustable sliding table, a connecting board, a second adjustable sliding table, a camera and a lens, the first adjustable sliding table is fixedly disposed on the support part, the bottom of the connecting board is connected to the first adjustable sliding table, and one side thereof is connected to the second adjustable sliding table, the camera is fixed at the top of the second adjustable sliding table, the lens is threaded connected to the camera, the lighting part comprises a light source, a light source clamping device, an adapter plate, a height variation sliding table, a first support plate, a single-axis horizontal sliding table, and a second support plate, the single-axis horizontal sliding table is fixed on one end of the second support plate, and the other end of the second support plate is fixed on the base, the first support plate is L-shaped, the bottom thereof is connected to the single-axis horizontal sliding table, one side thereof is connected to the height variation sliding table, a slider of the height variation sliding table is connected to one end of the second adapter plate, and the other end of the second adapter plate is connected to the light source clamping device; and the light source is connected to the light source clamping device.

In a class of this embodiment, the jet printing device further comprises a shell box disposed on the support part and covering the jet printing module, the substrate bearing and moving module and the roll-to-roll thin film conveying module, the shell box comprises a lower temperature control box, an upper temperature control box, a freezer and a heater, the lower temperature control box is fixed on the support part, and operates to isolate heat from the substrate bearing and moving module, the upper temperature control box is vertically disposed on the lower temperature control box, a separating plate operating to separate the upper temperature control box from the lower temperature control box is disposed in the middle of the upper temperature control box, and operates as a temperature control cavity of a print area, the freezer and the heater are respectively disposed on the top and one side of the upper temperature control box, and operate to control temperature therein. In a class of this embodiment, the nozzle of the jet printing module comprises an upper layer and a lower layer connected by bonding, the upper layer is a PDMS layer, and the lower layer is a silicon-based nozzle array layer, the PDMS layer operates to provide an inlet for external solution, and comprises a channel allowing the printing fluid to flow towards the lower layer, the silicon-based nozzle array layer integrates multiple small nozzles each having an electrode; and a high-voltage electrostatic field applied between the lower layer and the substrate for pattern printing allows the printing fluid at the nozzle to eject in the form of jet flow. In the invention, the first direction, the second direction and the third direction are vertical to each other.

According to another embodiment of the invention, there is provided a method for inkjet printing using the above-mentioned multifunctional electrohydrodynamic jet printing device, the method comprising steps of:

(1) selecting printing modes according to a pattern to be printed, the modes comprising electrospray, direct writing, and/or spraying;

(2) selecting a substrate material according a type of a printing device, the material comprising a rigid substrate and/or a flexible film; and (3) controlling a distance between the nozzle and the rigid substrate, printing fluid flow and/or voltage applied between the nozzle and the substrate, and simultaneously controlling a movement direction and a displacement of the jet printing module with respect to the substrate bearing and moving module and/or the roll-to-roll thin film conveying module, thereby achieving jet printing of various components and/or patterns.

According to still another embodiment of the invention, there is provided a method of inkjet printing of micro-electro-mechanical systems, biosensors, piezoelectric thin films, solar film batteries, or flexible and stretchable buckling structures, the method comprising applying the electrohydrodynamic jet printing device.

The invention facilitates different forms of jet by controlling a height between the nozzle and the substrate, viscosity of liquid, and applied voltage, and thus fast switching among three inkjet printing modes: single droplet inkjet printing, atomized droplet inkjet printing, and continuous jet printing, and solves a problem of using one device for structure manufacturing of different types of components. Meanwhile, by constructing the roll-to-roll thin film conveying module and the absorption platform according to different printing properties, the invention meets requirement of a component for different substrates. Furthermore, the print observation module makes it possible to observe forming of a pattern, as well as flying of a droplet in real time. An observation part for observing a pattern on the substrate employs direct vision, namely a direction of the lens is the same as that of the nozzle, which enables a user to directly observer printing results after printing of the pattern is completed, and an observation part for observing flying of the droplet employs backlight, namely a direction of a lens is horizontal, and a focal plane is disposed at the nozzle.

In this invention, the jet printing module comprises a movement platform controlling a nozzle to move and a nozzle, both operating to adjust and control three jet printing modes; a visual system for observing patterns on a substrate; a substrate bearing and moving module for bearing and fixing a rigid substrate and enabling the substrate to move relative to the nozzle; a roll-to-roll thin film conveying module for feeding and adsorbing a flexible substrate and guaranteeing that the surface of the flexible substrate is smooth and the flexible dielectric substrate is not to slide in movement; a print observation module for detecting a flight track of a droplet, observing overprinted patterns, and patterns on the substrate in real-time, and optically detecting a printing structure; and a temperature and humidity control module for controlling temperature and humidity in a cavity, and guaranteeing printing stability.

To print different patterns, a key technology used in this invention is to make use of cooperation of jet printing and movement platforms of different modules. Advantageously, the jet printing module comprises at least three orthogonal movement units, the substrate bearing and moving module comprises at least two orthogonal movement units, and the roll-to-roll thin film conveying module comprises a horizontal movement unit.

There are types of movement on substrates: the first one is to print patterns on sheet substrates (rigid substrates or flexible substrates), such as silicon wafers, conductive glass, steel sheets, PET polymer substrates and so on, and two movement units of the substrate bearing and moving module drive the substrate to move along a pattern track, and the nozzle is kept fixed after a printing mode is determined, then it is possible to print deposition of points, fibers and films; the second one is to use a coiled material of a flexible film, such as a polyester film (PET), a polyimide film (PI) and so on, and the roll-to-roll thin film conveying module transfers the film to a print position, the nozzle is kept fixed after the printing mode is determined, two orthogonal and horizontal movement units of the jet printing module generate the pattern track, and then it is possible to print points, fibers and films on the flexible film.

To facilitate multifunctional printing of different patterns, a key technology in this invention is to select an appropriate jet printing mode and operation of the movement platform according to specific objects. Specifically, for a full printing RFID, the first type of movement and the second type of movement are combined with the continuous jet for producing an antenna thereof, and the on-demand jet is used for producing a resistor and an inductor; as for a biosensor, the first type of movement is combined with the continuous jet for producing an electrode, and the atomized droplet and the second type of movement are used for producing an active layer thin film; as for a light emitting diode, the first type of movement and the second type of movement are combined with the atomized droplet for producing different sheet-shaped or continuous functional films; as for a solar cell, the first type of movement and the second type of movement are combined with the continuous jet for producing a back electrode on a single substrate or continuous substrates.

To accurately position a nano-fiber and a droplet, and ensure consistency of a print structure, stability of a print environment must be guaranteed. In addition, to improve applicability of devices and reduce requirement for working conditions, a micro environment control unit encapsulated by a shell box is used for controlling temperature and humidity in the cavity, and the micro environment control unit controls temperature in manners of conduction and radiation using semiconductor heating sheets and cooling sheets, so as to overcome defects caused by a traditional air cooling system. The shell box is made of heat isolation materials capable of reducing heat loss between temperature and the environment, and the semiconductor heating sheets and the cooling sheets are made of metal featuring good thermal conductivity and being capable of promptly changing temperature thereof.

To facilitate high-efficiency printing, a key technology in this invention is to replace a single nozzle with a nozzle array, and to print the array in modes of single droplet and continuous jet. Specifically, a print state of each nozzle can be controlled alone by parsing a pattern, thereby enabling or disabling each nozzle, and achieving high-efficiency printing, In this invention, the movement module comprises at least three orthogonal movement units, the substrate bearing and moving module comprises at least two orthogonal movement units, and the roll-to-roll thin film conveying module comprises a horizontal movement unit.

In this invention, the substrate is vacuum absorbed on the substrate bearing and moving module, and comprises an upper layer and a lower layer connected by bonding, the upper layer is a PDMS layer, and the lower layer is a silicon-based nozzle array layer. The silicon-based nozzle array layer integrates multiple small nozzles each having a gold electrode as a control interface connected to an external voltage control circuit. Small holes etched on a silicon wafer operates as an outlet of solution, and is capable of enabling a Taylor cone formed at the nozzle to generate jet flow as a high-voltage electrostatic field is applied between the lower layer and a bottom plate.

In this invention, the nozzle is preferably an electrohydrodynamic jet printing head array.

In this invention, a process for jet printing a pattern comprises: printing an input pattern, parsing format of the pattern, preheating a nozzle (applying voltage and feeding ink), starting printing of the pattern, conducting online detecting and motion parameter control on the pattern, and finishing printing.

In this invention, multiple small holes are disposed on the absorption roller sleeve, and operate to absorb a film on an enclosed space that is formed by a vacuum pump on the surface of the sleeve.

In this invention, an insulation board is disposed between the absorption platform and a slider, and operates for insulating electrical interference.

The electrohydrodynamic inkjet printing device of the invention has the following advantages over the conventional jet printing system:

1. the electrohydrodynamic inkjet printing device features integrated processing capability in multiple jet printing modes, and is capable of printing various types of components;

2. the electrohydrodynamic inkjet printing device makes it possible to select different inkjet printing modes and substrate materials;

3. the electrohydrodynamic inkjet printing device employs an electrohydrodynamic jet printing mechanism, which features higher precision and is not prone to be affected by a diameter of the nozzle in comparison with the conventional jet printing mode;

4. the electrohydrodynamic inkjet printing device employs electrostatic force as driving force, which features large jet drag force and is applicable for high-viscosity solution;

5. the electrohydrodynamic inkjet printing device features a simple process, and the nozzle has a simple structure;

6. since the observation module is used, the invention makes it possible to observe flying of a droplet in real time, and thus improving print performance; and 7. the electrohydrodynamic inkjet printing device can continuously deposit various patterns on a flexible or rigid substrate with large area.

BRIEF DESCRIPTION OF ACCOMPANYING DRAWINGS

DETAILED DESCRIPTION OF THE INVENTION

For clear understanding of the objectives, features and advantages of the invention, detailed description of the invention will be given below in conjunction with accompanying drawings and specific embodiments. It should be noted that the embodiments are only meant to explain the invention, and not to limit the scope of the invention. In addition, the technical features involved in the following detailed descriptions could be combined if no conflicts.

According to an inkjet printing apparatus and method disclosed in this invention, the apparatus can be applied in traditional printed circuit boards, flexible electronic devices, as well as biochips, sensors, MEMS components and so on.

Figure 1:
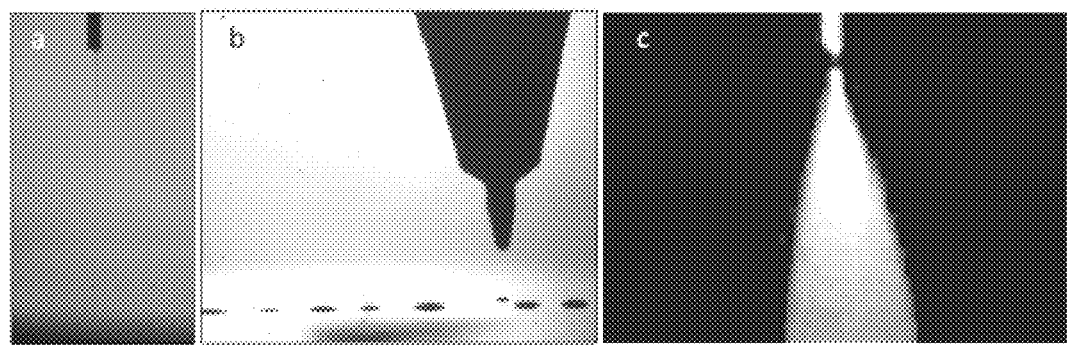
FIG. 1 illustrates three printing modes, namely on-demand inkjet of a single droplet, spraying of atomized droplets, and direct writing of continuous jet.

As shown in FIG. 1, three printing modes are illustrated, namely single continuous jet (a), single droplet (b) and atomized droplets (c) achieved by controlling distance between a nozzle and a substrate, viscosity of liquid, and voltage that is applied based on a process of the invention.

Figure 2:
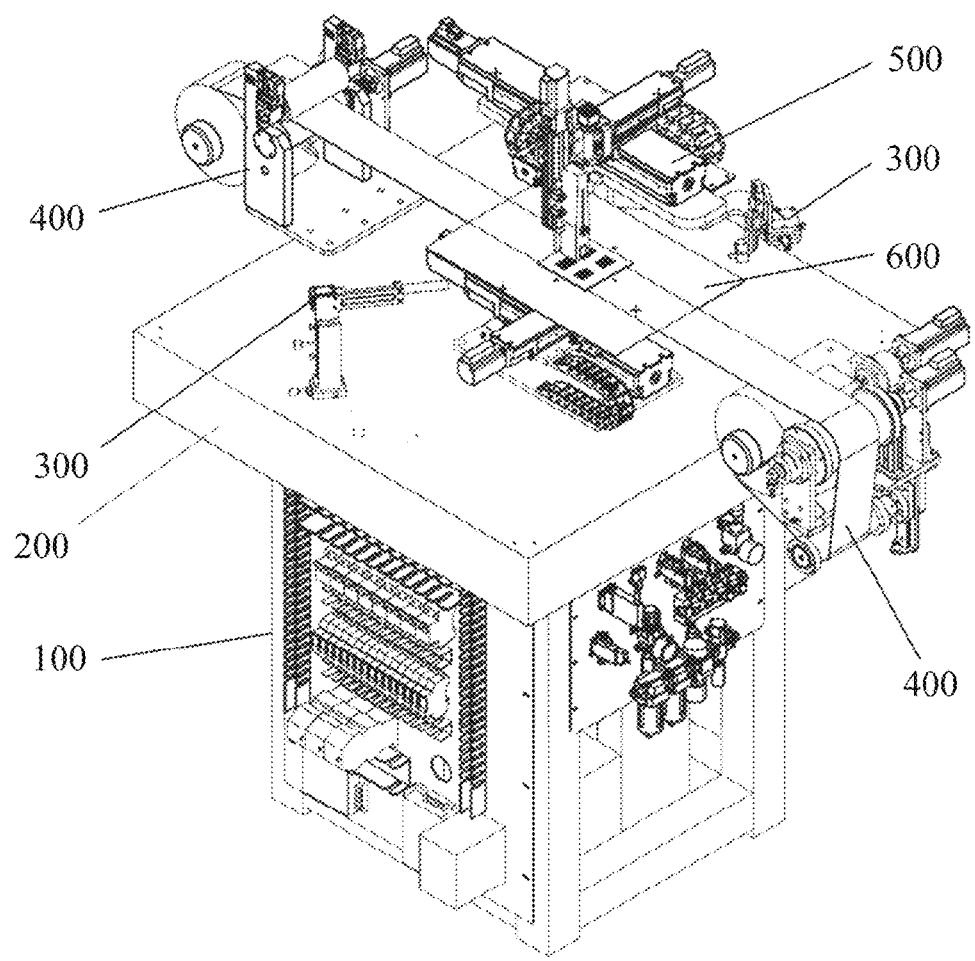
FIG. 2 is a schematic diagram of a multifunctional electrohydrodynamic jet printing device of an exemplary embodiment of the invention.
Figure 3:
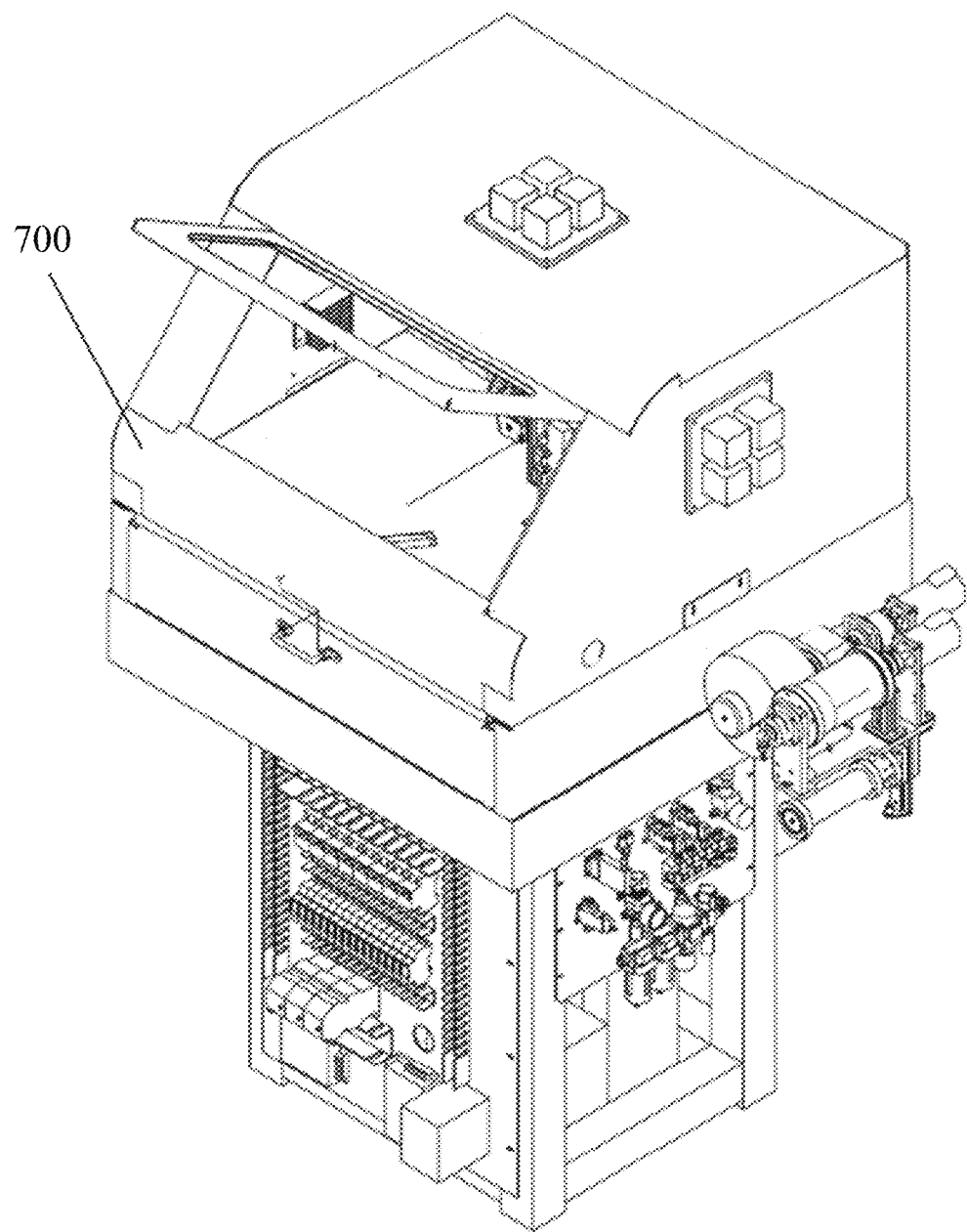
FIG. 3 is a perspective view of a multifunctional electrohydrodynamic jet printing device of an exemplary embodiment of the invention.

As shown in FIGS. 2 and 3, a schematic diagram and a perspective view of the inkjet printing apparatus of the invention are respectively illustrated. The apparatus comprises a control unit (namely a control cabinet) 100, a marble support part 200, a printing observation module 300, roll-to-roll thin film conveying module 400, a jet printing module 500, a substrate bearing module 600, and a shell box 700.

As shown in FIG. 2, the printing observation module 300 comprises an observation part and a lighting part.

Figure 4:
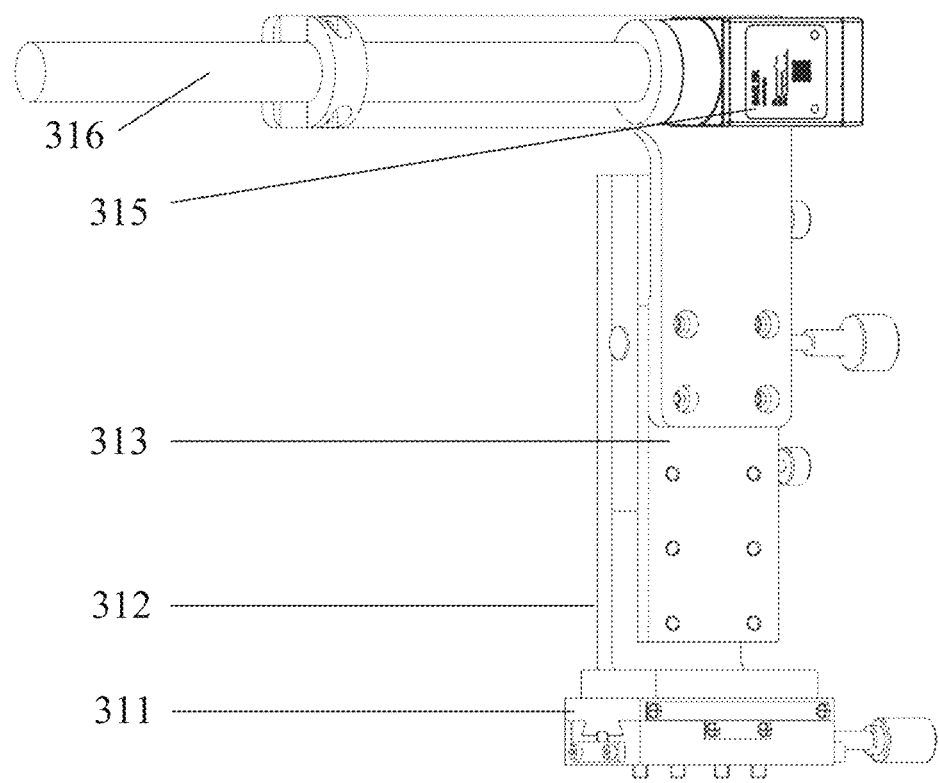
FIG. 4 is a schematic diagram of an observation part of a print observation module of a multifunctional electrohydrodynamic jet printing device of an exemplary embodiment of the invention.
Figure 5:
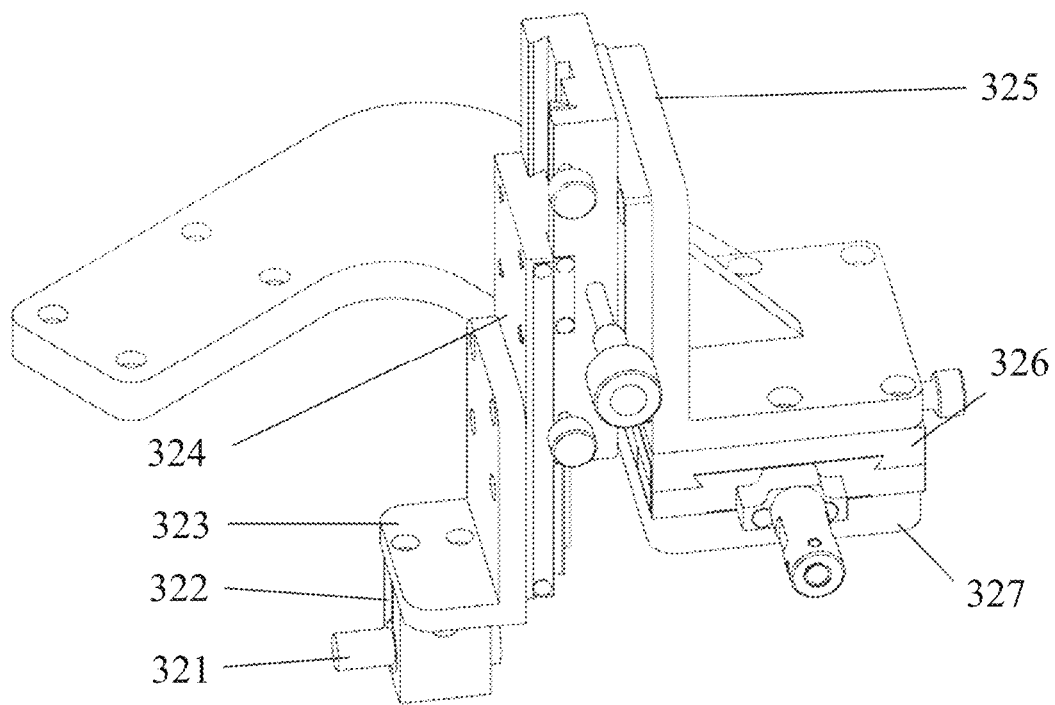
FIG. 5 is a schematic diagram of a lighting part of a print observation module of a multifunctional electrohydrodynamic jet printing device of an exemplary embodiment of the invention.

As shown in FIGS. 4 and 5, FIG. 4 illustrates the observation part, and FIG. 5 illustrates the lighting part. The observation part comprises a first adjustable sliding table 311, a connecting board 312, a second adjustable sliding table 313, a camera 315, and a lens 316. The first adjustable sliding table 311 is fixedly disposed on the support part 200 via a screw. The bottom of the connecting board 312 is screw connected to the first adjustable sliding table 311, and one side thereof is screw connected to the second adjustable sliding table 313. The camera 315 is fixed at the top of the second adjustable sliding table 313, and the lens 316 is threaded connected to the camera 315.

The lighting part comprises a light source 321, a light source clamping device 322, a second adapter plate 323, a height variation sliding table 324, a support plate 325, a single-axis horizontal sliding table 326, and a support plate 327. The single-axis horizontal sliding table 326 is fixed on the support plate 327 via a screw, the support plate 325 is L-shaped, the bottom thereof is screw connected to the single-axis horizontal sliding table 326, and one side thereof is connected to the height variation sliding table 324. A slider of the height variation sliding table 324 is connected to one end of the second adapter plate 323, and the other end of the second adapter plate 323 is connected to the light source clamping device 322. The light source 321 is screw connected to the light source clamping device 322. In operation, the light source is switched on; light is straightly emitted into the lens 360 and then captured by the camera 315. If the nozzle is on the optical path of the light, a flying track of jet on space can be clearly observed, that realizes real-time monitoring of jet printing.

Figure 6:
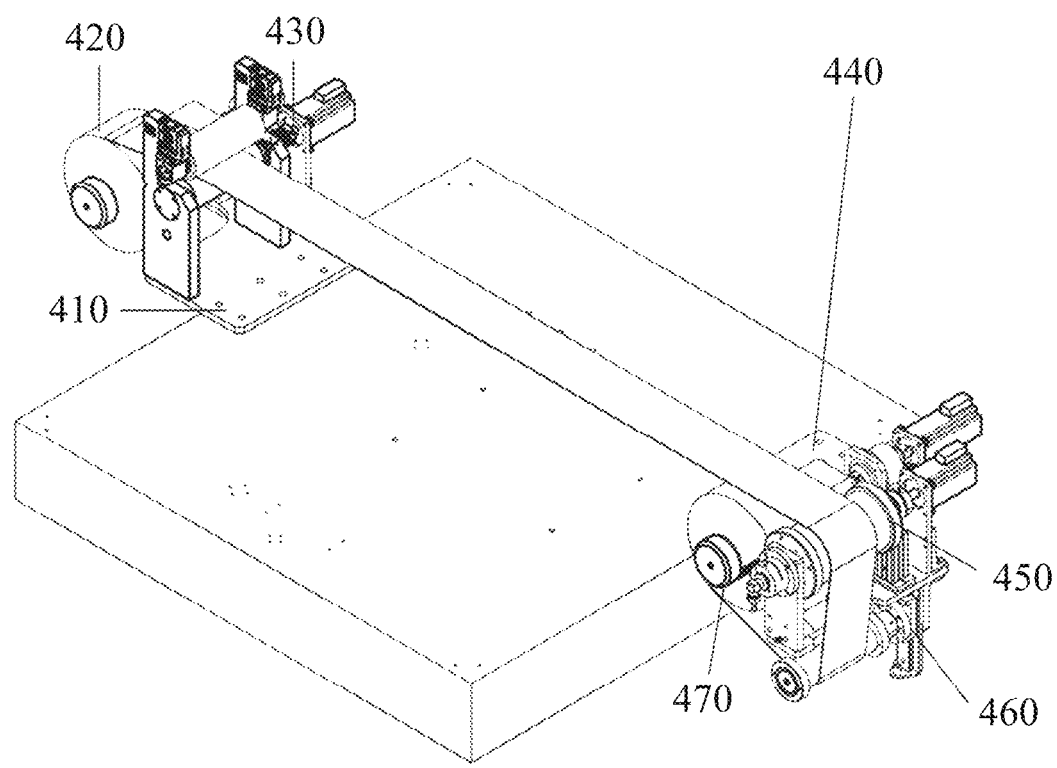
FIG. 6 is a schematic diagram of a roll-to-roll thin film conveying module of a multifunctional electrohydrodynamic jet printing device of an exemplary embodiment of the invention.
Figure 7:
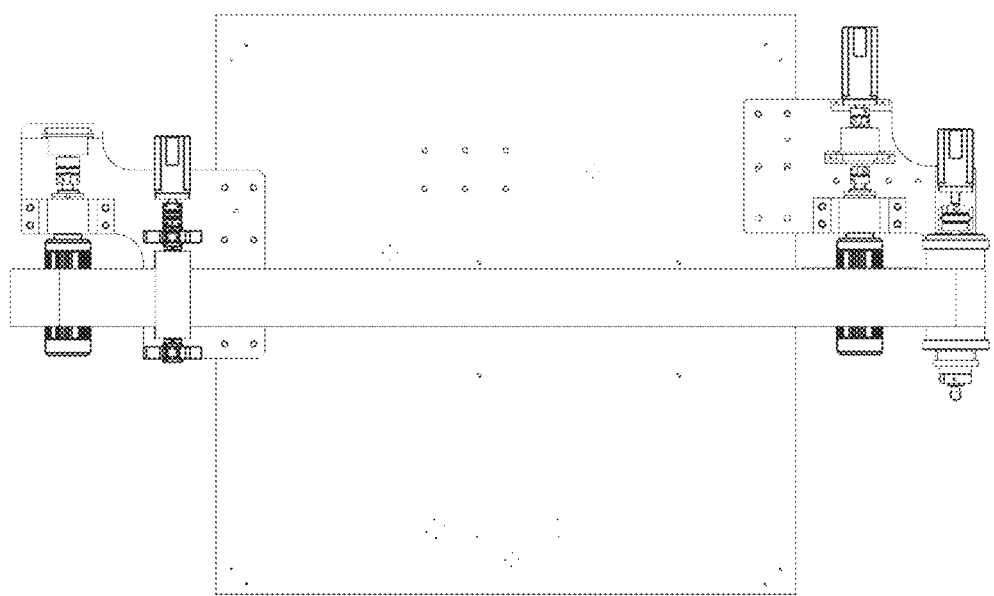
FIG. 7 is a top view of a roll-to-roll thin film conveying module of a multifunctional electrohydrodynamic jet printing device of an exemplary embodiment of the invention.
Figure 8:
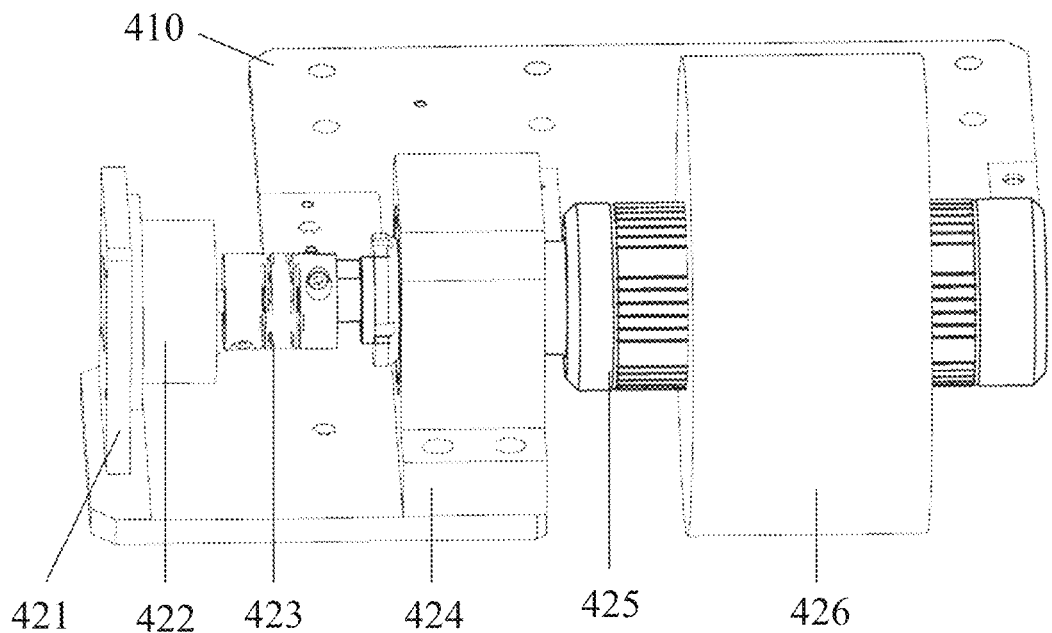
FIG. 8 is a schematic diagram of a material emptying roller of a roll-to-roll thin film conveying module of a multifunctional electrohydrodynamic jet printing device of an exemplary embodiment of the invention.

As shown in FIGS. 6 and 7, the roll-to-roll thin film substrate conveying module 400 comprises an unwinding part (comprising an unwinding plate 410, an unwinding roller 420, and a nip roller 430) and a winding part (comprising a winding plate 440, an vacuum roller 450, a dance roller 460, and a winding roller 470), and functions and structures of these two parts are as follows:

As shown in FIG. 8, the unwinding roller 420 comprises a magnetic particle brake connection plate 421, a magnetic particle brake 422, a coupling 423, a bearing support 424, an inflatable shaft 425, and a material roll 426. The magnetic particle brake connection plate 421 being a vertical plate operates to fix the magnetic particle brake, the bottom thereof is screw connected to the unwinding plate 410, and one side thereof is connected to one end of the magnetic particle brake 422 via a flange with a threaded hole. The other end of the magnetic particle brake 422 is tightly received in a connection hole of the coupling 423 via a screw. An optical axis of the inflatable shaft 425 passes through a bearing hole in the bearing support 424, and is connected to one end of the coupling 423. The bottom of the bearing support 424 is connected to the unwinding plate 410, so as to support the inflatable shaft 425, and to ensure flexible rotation thereof. During connection, the coupling 423, the bearing hole in the bearing support 424 and the inflatable shaft 425 are coaxial. The material roll 426 is wounded on a flatulence end of the inflatable shaft 425, and maintains a tension state.

Figure 9:
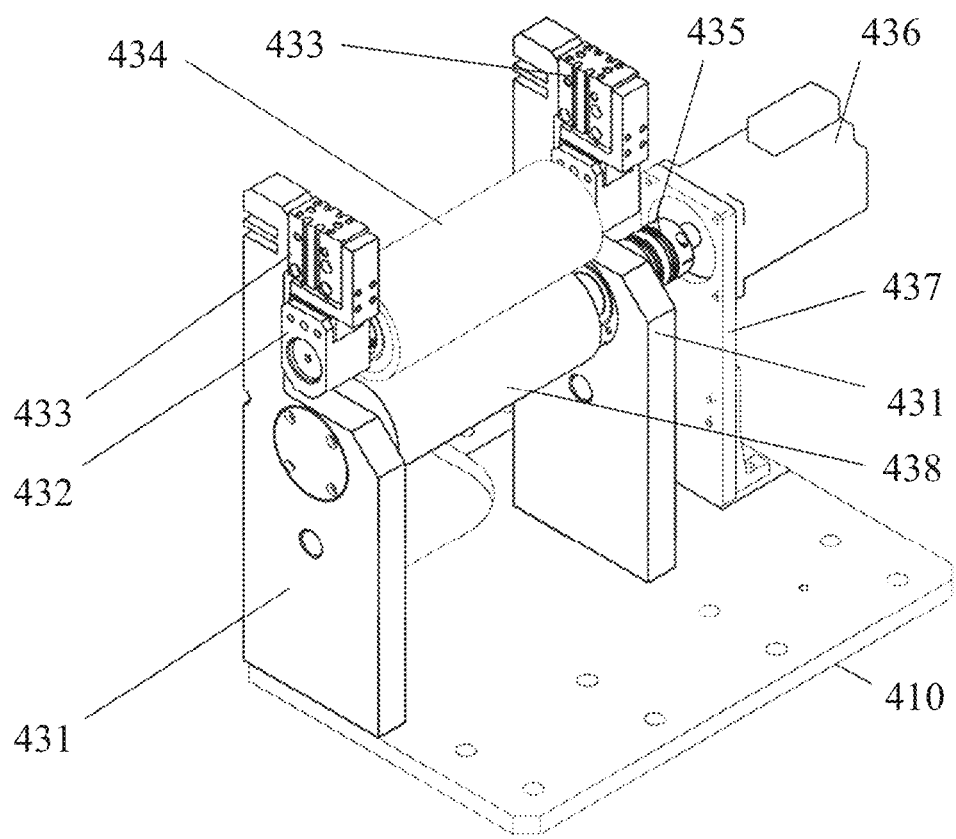
FIG. 9 is a schematic diagram of a double roller of a roll-to-roll thin film conveying module of a multifunctional electrohydrodynamic jet printing device of an exemplary embodiment of the invention.

As shown in FIG. 9, the nip roller 430 comprises a pair of nip roller support plates 431, a roller connection part 432, a pair of cylinders 433, an upper roller 434, a coupling 435, a motor 436, a motor support plate 437, and a lower roller 438. Connection of these components is as follows: the nip roller support plates 431 parallel to each other are symmetrically disposed on the unwinding plate 410, and a distance between them is determined by a length of the upper roller 434. A notch is disposed on an upper end of the nip roller support plate 431, a cylinder 433 is disposed at the top of the notch, a body of the cylinder is fixed at the notch on the upper end of the nip roller support plate 431, a cylinder piston is connected to the roller connection part 432, a bearing is received in a bearing hole of the roller connection part 432, the upper roller 434 is a step-shaped axis, and both ends thereof are received in the bearing hole. The lower roller 438 and upper roller 434 are vertically disposed and parallel to each other, and tangent to each other as the cylinder piston is completely extended therefrom. The lower roller 438 is also a step-shaped axis, one end thereof is fixed in the bearing hole of one nip roller support plate 431, the other end thereof passes through the bearing hole of the other nip roller support plate 431, and an axis end thereof is connected to the coupling, and tightened via a screw. The other end of the coupling 435 is connected to a rotating shaft of the motor 436, the motor 436 is disposed on the motor support plate 437, the motor support plate 437 is fixed on the unwinding plate 410 via a screw, and parallel to the nip roller support plate 431. As the motor operates, the rotating shaft rotates and drives the lower roller 438 to rotate.

Figure 10:
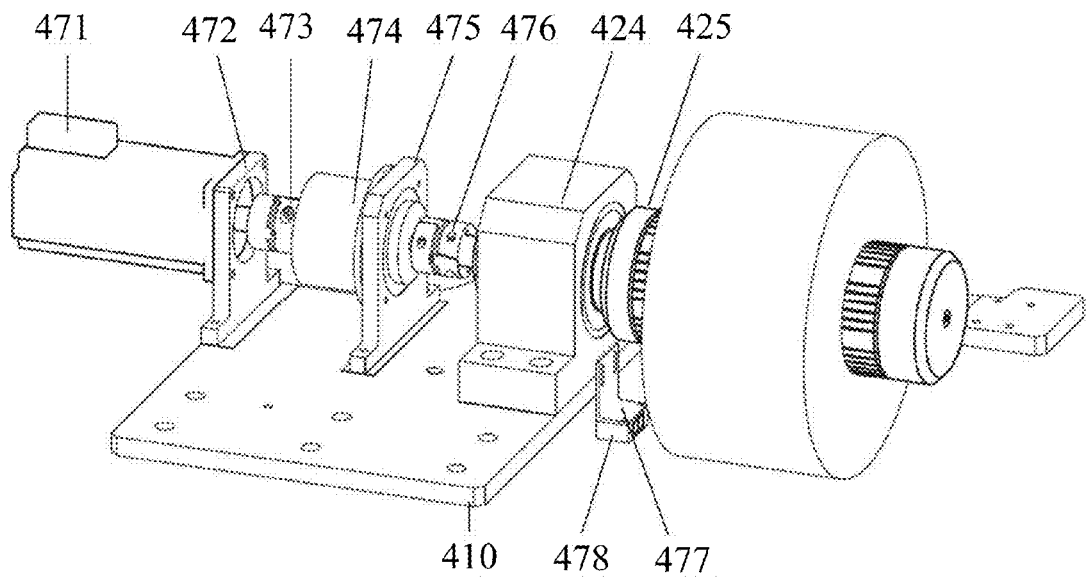
FIG. 10 is a schematic diagram of an unwinding roller of a winding part of a roll-to-roll thin film conveying module of a multifunctional electrohydrodynamic jet printing device of an exemplary embodiment of the invention.

As shown in FIG. 10, the winding roller 470 of the winding part comprises a winding roller motor 471, a roller motor support part 472, a coupling 473, a magnetic powder clutch 474, a magnetic powder clutch support plate 475, another coupling 476, a bearing support 424, an inflatable shaft 425, a sensor base 477, and a photoelectric sensor 478. The roller motor support part 472 operates to fix a motor, and the bottom thereof is screw connected to the winding plate 440. A motor shaft is received in a hole of the coupling 473, and tightened via a screw. An optical axis of the magnetic powder clutch 474 is tightly received in a hole on one end of the coupling 473. The magnetic powder clutch 474 is fixed on the winding plate 440 via the magnetic powder clutch support plate 475, and a hole is disposed at the center of the magnetic powder clutch support plate 475. The other end of the optical axis of the magnetic powder clutch 474 is connected to an end hole of the other coupling 476. An optical axis of the inflatable shaft 425 passes through the bearing hole of the bearing support 424, and is received in the other end hole of the coupling 476. The bottom of the bearing support 424 is connected to the winding plate 440, so as to support the inflatable shaft 425, and to ensure flexible rotation thereof. During connection, the coupling 423, the bearing support 424 and the inflatable shaft 425 are coaxial.

Figure 11:
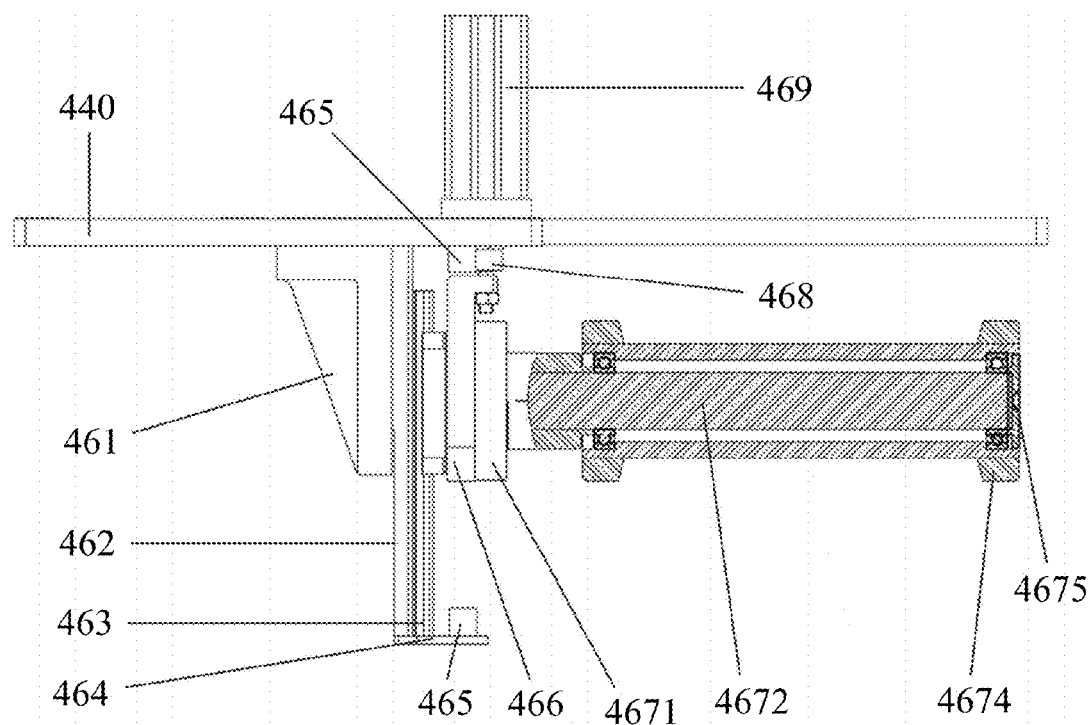
FIG. 11 is a schematic diagram of a dance roller of a roll-to-roll thin film conveying module of a multifunctional electrohydrodynamic jet printing device of an exemplary embodiment of the invention.

As shown in FIG. 11, the dance roller comprises an angle brace 461, a roller mounting plate 462, a guide slider 463, a stop plate 464, a collision-proof block 465, a first adapter plate 466, an idler roller 4673, an adaptor 468, and a frictional cylinder 469. The idler roller 4673 comprises a flange base 4671, an idler roller axis 4672, a bearing pipe 4674, and a bearing cover 4675. The roller mounting plate 462 is connected to the winding plate 440 via the angle brace 461, and the roller mounting plate 462 is vertical to the winding plate 440. A flange of the frictional cylinder 469 is screw connected to the winding plate 440.

Figure 12:
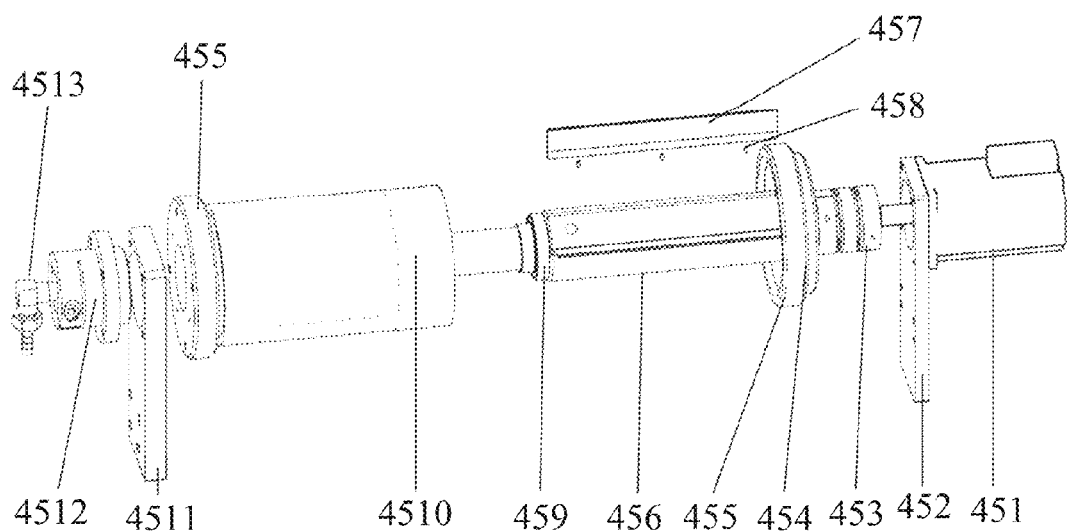
FIG. 12 is an exploded view of an absorption roller of a roll-to-roll thin film conveying module of a multifunctional electrohydrodynamic jet printing device of an exemplary embodiment of the invention.

As shown in FIG. 12, an exploded view of the adsorption roller is illustrated. The adsorption roller 450 comprises an adsorption roller motor 451, a roller motor support plate 452, a coupling 453, a roller motor connecting plate 454, a pair of end covers 455, an adsorption roller axis 456, a pair of stop plates 457, a spring 458, a bearing 459, a pair of sleeves 4510, a support plate 4511, a shaft bearing 4512, and a gas path adaptor 4513. The support plate 4511 of the adsorption roller is fixed on the winding plate 440 via a screw. The adsorption roller axis 456 is a step-shaped core shaft, and comprises a first segment, a second segment, and a third segment. Pair of grooves is disposed on the second segment of the adsorption roller axis 456, and an angle there between is 60-70°. A hole on the surface of the first segment of the adsorption roller axis 456 is connected to a hole on the surface of the second segment. The front of the first segment of the adsorption roller axis 456 is fixed on the support plate 4511 via the shaft bearing 4512. The gas path adaptor 4513 is disposed on the surface of the first segment of the adsorption roller axis 456 via a thread. The stop plates 457 are respectively disposed in the grooves on the first segment of the adsorption roller axis 456, and a length of the stop plate 457 is equal to that of the first segment. The spring 458 is disposed at the bottom of the stop plate 457 in contact with the adsorption roller axis, and operates to force the stop plate 457 to move outwards along a radius of the adsorption roller axis. The end covers 455 are respectively disposed on the first segment and the third segment of the adsorption roller axis 456 via the bearing 459, and in contact with both ends of the second segment and those of the stop plate 457, and operate to overcome friction between the stop plate 457 and itself, and to rotate around the axis. The sleeves 4510 are respectively fixed connected to the end covers 455, and an axis of the sleeve 4510 coincides with that of the end cover 455. Inner wall of the sleeve 4510 is in contact with top surface of the stop plate 457, one end of the end cover 455 disposed on the third segment is fixed to the roller motor connecting plate 454 via a screw, and the other end thereof is connected to the motor 451 via the coupling 453. The adsorption roller motor 451 is fixed on the winding plate 440 via the roller motor support plate 452. The end cover 455, the adsorption roller axis 456, the stop plate 457, and the sleeve 4510 form an enclosed region, and a vacuum pump enables the enclosed region to reach a certain vacuum degree. Holes on the sleeve 4510 adsorb a film on the surface of the sleeve 4510, and the motor drives the sleeve to rotate thereby achieving film feeding.

Figure 13:
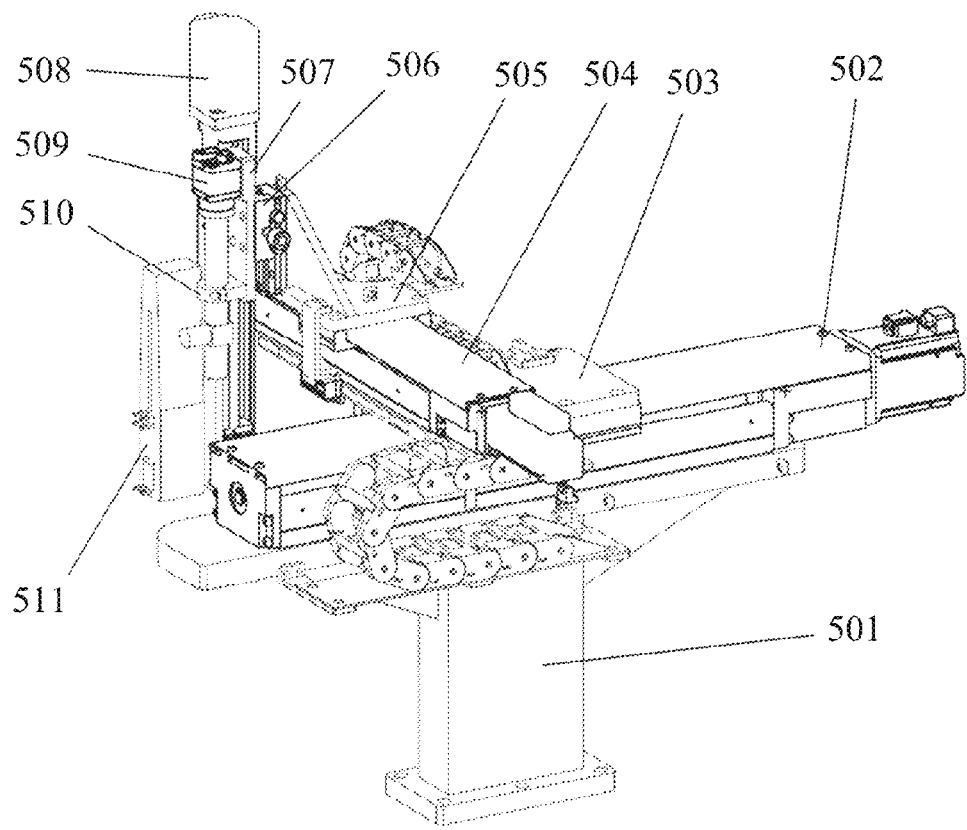
FIG. 13 is a schematic diagram of a jet printing module of a multifunctional electrohydrodynamic jet printing device of an exemplary embodiment of the invention.
Figure 14:
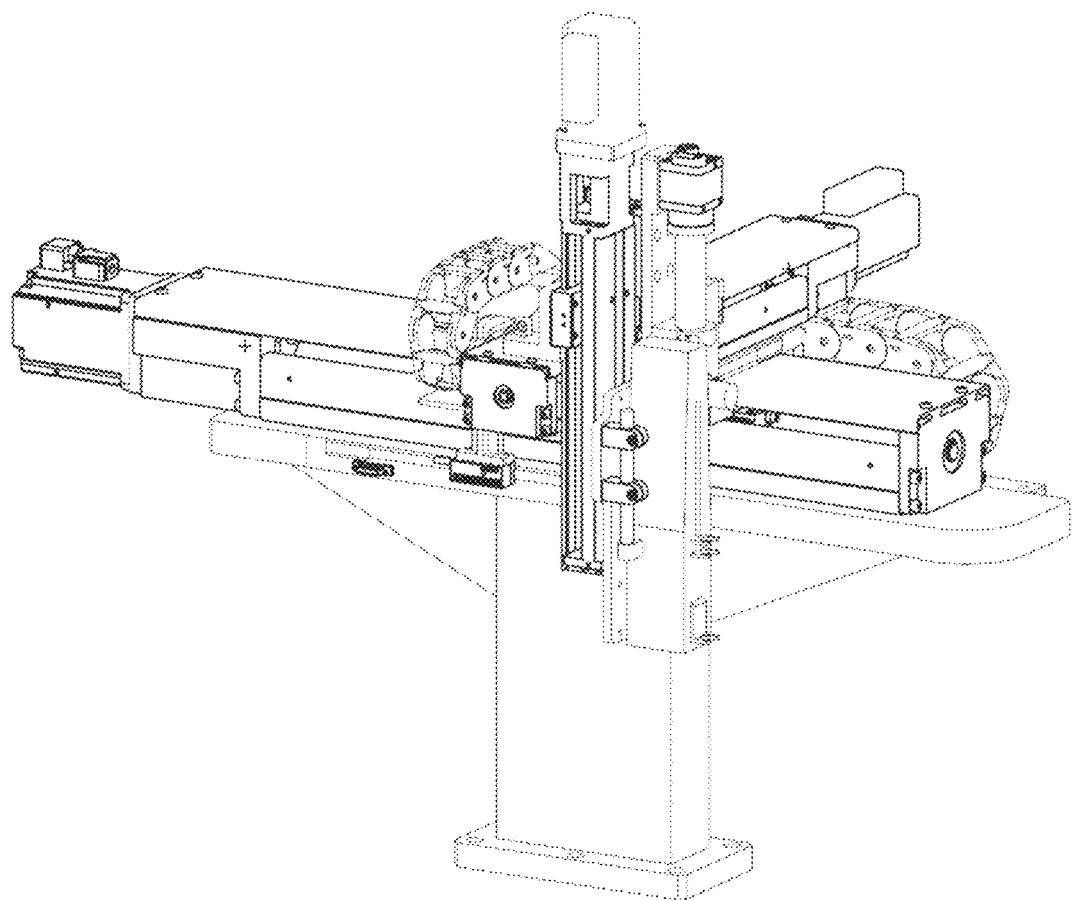
FIG. 14 is a side view of a jet printing module of a multifunctional electrohydrodynamic jet printing device of an exemplary embodiment of the invention.

FIGS. 13 and 14 illustrate a jet printing module, such as a three-axis Cartesian coordinate robot, comprising a base 501, an X-direction motion module 502, a first direction connecting plate 503, a Y-direction motion module 504, a second direction connecting plate 505, a single-axis sliding table 506, a camera fixing plate 507, a Z-direction motion module 508, a camera 509, a lens 510, and an injection pump 511. The base 501 is screw connected to the support part 200, the X-direction motion module 502 is fixed on the base 501, the first direction connecting plate 503 is fixed on a slider of the X-direction motion module 502 via a screw, and operates to support the Y-direction motion module 504, the second direction connecting plate 505 is fixed on a slider of the Y-direction motion module 504 via a screw, and operates to support the single-axis sliding table 506, the Z-direction motion module 508 is directly fixed on the single-axis sliding table 506, a slider of the Z-direction motion module 508 is connected to the camera fixing plate 507, and the camera 509 and the injection pump 511 are sequentially disposed thereon. The lens 510 is buckled with the camera 509.

Figure 15:
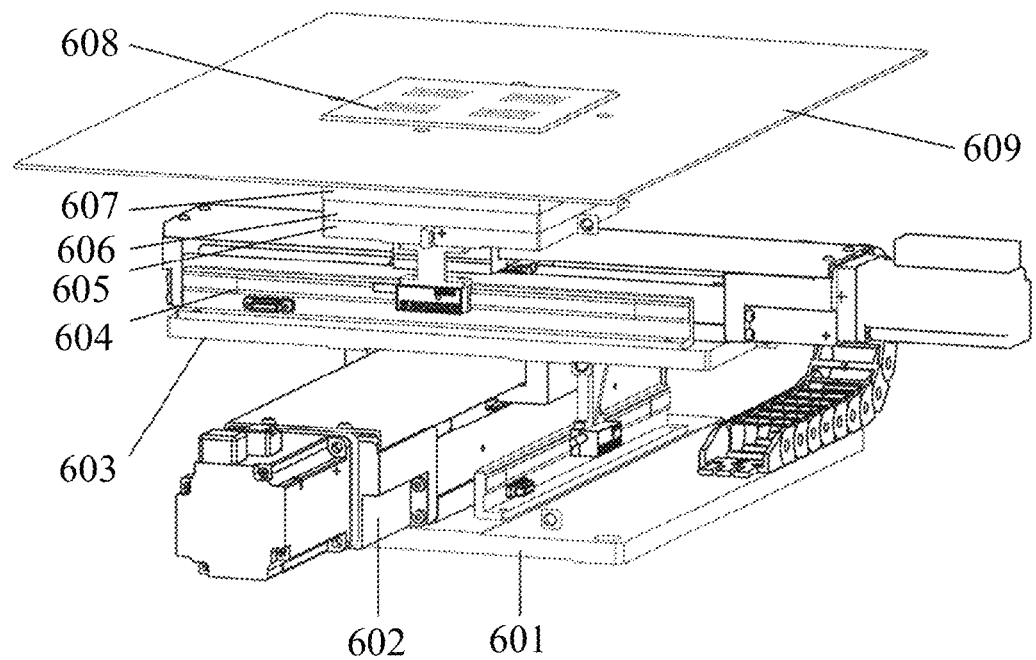
FIG. 15 is a schematic diagram of a substrate bearing and moving module of a multifunctional electrohydrodynamic jet printing device of an exemplary embodiment of the invention.

FIG. 15 illustrates the substrate bearing and moving module such as a two-stage Cartesian motion platform package, comprising a base 601, an X-axis motion module 602, a movable connecting plate 603, a Y-axis motion module 604, a slider connecting plate 605, an adsorption connecting board 606, an insulation board 607, an adsorption platform 608, and a stop plate 609. The base 601 is directly fixed on the marble support part 200, and a threaded hole is disposed thereon for fixing the X-axis motion module 602, a slider of the X-axis motion module 602 is connected to the movable connecting plate 603, and operates to support and fix the Y-direction motion module 604. The slider connecting plate 605 is fixed on a slider of the Y-direction motion module 604, and operates to support the adsorption platform 608. The adsorption platform 608 and the slider connecting plate 605 are sequentially connected to the adsorption connecting board 606 and the insulation board 607, and the insulation board 607 operates to isolate electrical interference. The adsorption platform 608 is connected to the insulation board 607, and the stop plate 609 is disposed on periphery of the adsorption platform 608, and operates to cover the motion platform at the bottom thereof.

Figure 16:
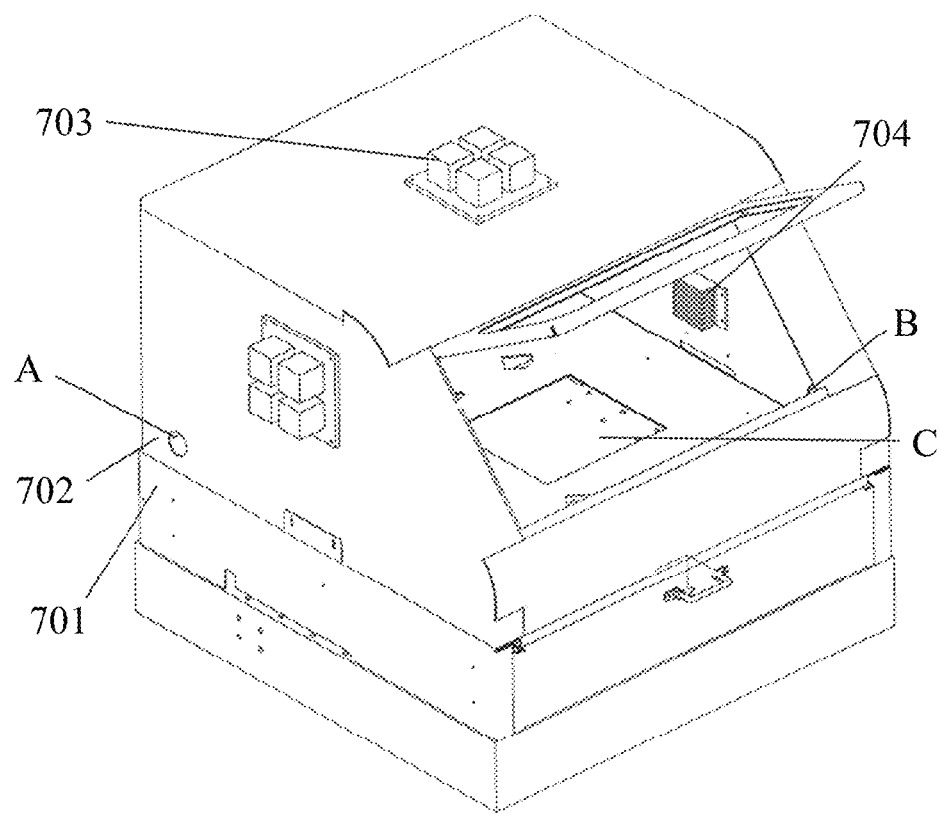
FIG. 16 is a schematic diagram of a shell box of a multifunctional electrohydrodynamic jet printing device of an exemplary embodiment of the invention.

FIG. 16 is a schematic diagram of a shell box of the printing apparatus of the invention, comprising a lower temperature control box 701, an upper temperature control box 702, a freezer 703, and a heater 704. The lower temperature control box 701 is fixed on the marble support part 200, and operates to isolate heat from the substrate bearing and moving module 600, and to prevent precision components on the motion platform from being affected by droplets' splashing. The upper temperature control box 702 is vertically disposed on the lower temperature control box 701, a separating plate operating to separate the upper temperature control box 702 from the lower temperature control box 701 is disposed in the middle of the upper temperature control box 702, thereby forming a temperature control cavity of a print area. The freezer 703 and the heater 704 are disposed at the top and side wall of the upper temperature control box 702, and control temperature therein via a computer and a sensor in real-time. A on the side wall is an air inlet connected to an external humidity control module, B is another air inlet connected to the external humidity control module, C is a square window opened on the separating plate, the adsorption platform 608 of the substrate bearing module 600 extends form the window, and the stop plate 609 covers the window, thereby preventing droplets from splashing the box below.

Figure 17:
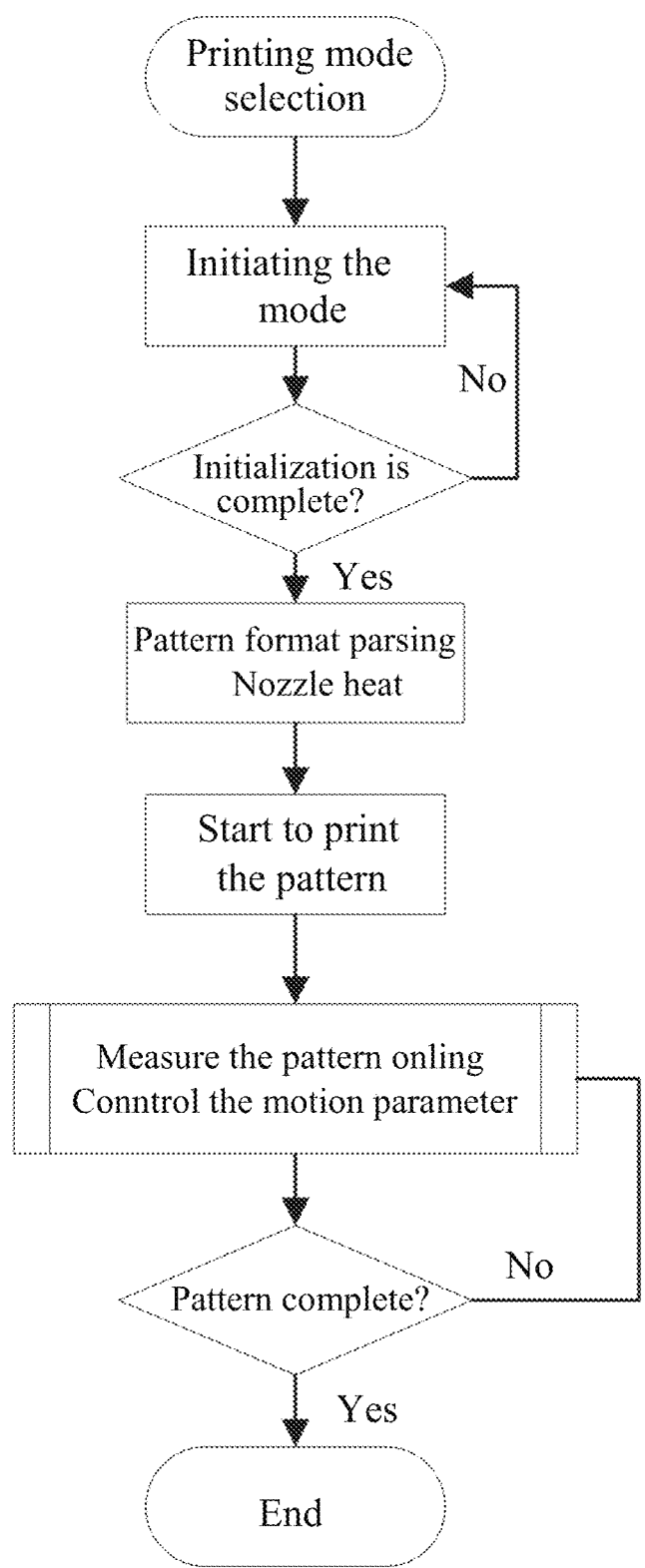
FIG. 17 illustrates jet printing of a pattern.

FIG. 17 illustrates a process for jet printing a pattern, comprising: input an printing pattern, parsing format of the pattern, preheating a nozzle (applying voltage and feeding ink), starting printing of the pattern, conducting online detecting and motion parameter control on the pattern, and finishing printing.

In this embodiment, the control unit comprises control components for all the above-mentioned parts, such as drivers, control cards and other electric connections for motors of all motion modules; vacuum generators; various power sources; industrial control computers, temperature or humidity controllers, nozzle controllers and so on.

Figure 20:
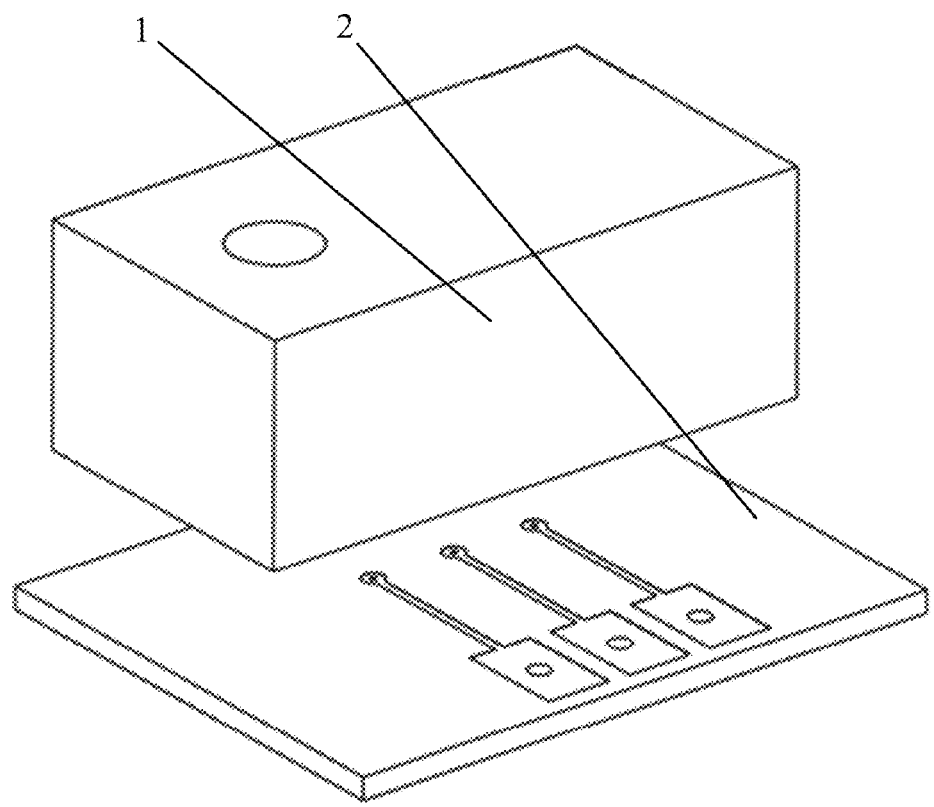
FIG. 20 illustrates typical patterns obtained in three printing modes of a multifunctional electrohydrodynamic jet printing device.

To solve a problem of low printing efficiency with conventional glass capillary nozzle and stainless steel nozzle, this invention employs an electrohydrodynamic jet printing head array, as shown in FIG. 20. The nozzle comprises an upper layer 1 and a lower layer 2 connected by bonding, the upper layer is a PDMS layer, and the lower layer is a silicon-based nozzle array layer. Based on a principle of electrohydrodynamic jet printing, the nozzle generates jet by controlling voltage so as to form ink droplets or liquid lines and to print a pattern. Specifically, the PDMS layer operates to provide an inlet for external solution, and comprises a channel allowing the solution to flow towards the lower layer. Since PDMS features transparency, stable property, and good formability, it is widely used in the field of micro-fluid chips. In this embodiment, to produce the PDMS layer, firstly a die needs to be designed and processed, then components forming the PDMS material are mixed with a certain percentage (for example prepolymer:curing agent=10:1) thereby forming an initial PDMS solution. Thereafter, the solution is casted into the die and heated to 100° C. for 15 min, and thus the PDMS layer is formed. The silicon-based nozzle array layer integrates multiple small nozzles each having a gold electrode as a control interface connected to an external voltage control circuit. Small holes etched on a silicon wafer operates as an outlet of solution, and is capable of enabling a Taylor cone formed at the nozzle to generate jet flow as a high-voltage electrostatic field is applied between the lower layer and a bottom plate. Fabrication of the silicon-based nozzle array layer comprises several steps of standard semiconductor processing technology: designing a mask plate for lithography, lithography, development, sputtering/ICP etching to form the nozzle array layer. The nozzle array layer features accurate positioning of patterns, as well as stable printing.

This invention is directed to multiple types of substrates and three printing modes, and has several combinations formed thereby, operation of some typical ones therefrom will be described hereinafter.

Example 1

Figure 18:
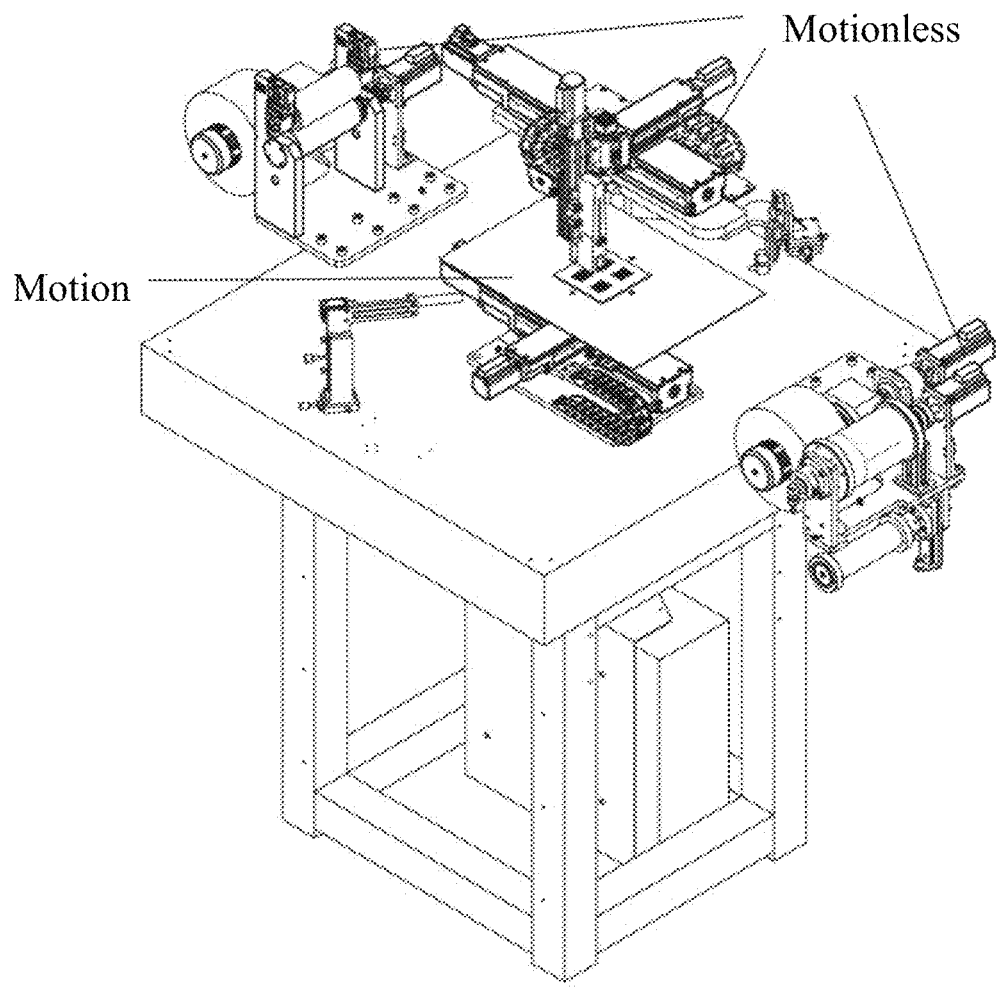
FIG. 18 illustrates movement of all parts of a multifunctional electrohydrodynamic jet printing device operating in one mode.

The jet printing module 500 and the substrate bearing and moving module 600 work together, and print patterns on the rigid substrate. Firstly, the substrate bearing and moving module 600 is initialized, and the X-axis motion module 602 and the Y-axis motion module 604 are adjusted so that the slider moves to the center of a motion displacement thereof. Then the rigid substrate, such as a silicon wafer, is placed at the center of the adsorption platform, and the vacuum pump is enabled by a control module, at this time negative pressure is formed at the surface of the vacuum adsorption platform, and the substrate is tightly absorbed on the adsorption platform. After that, movement of three motion modules of the jet printing module 500 is adjusted thereby enabling the nozzle to align with an edge of the substrate, namely a zero point of the printing apparatus (a height between the nozzle and the substrate determining the jet printing mode can be freely set according to calibration results of experiments). Then the jet printing module 500 stops moving, and remains static during printing, the substrate bearing and moving module 600 moves during printing and forms the patterns, and states of all modules thereof are illustrated in FIG. 18. A process for jet printing a pattern comprises: input a printing pattern, parsing format of the pattern, preheating a nozzle (applying voltage and feeding ink), starting printing of the pattern, conducting online detecting and motion parameter control on the pattern, and finishing printing. This kind of operation is suitable for printing small-area and high-precision components, such as micro-electro-mechanical system (MEMS) and biosensors.

Example 2

Figure 19:
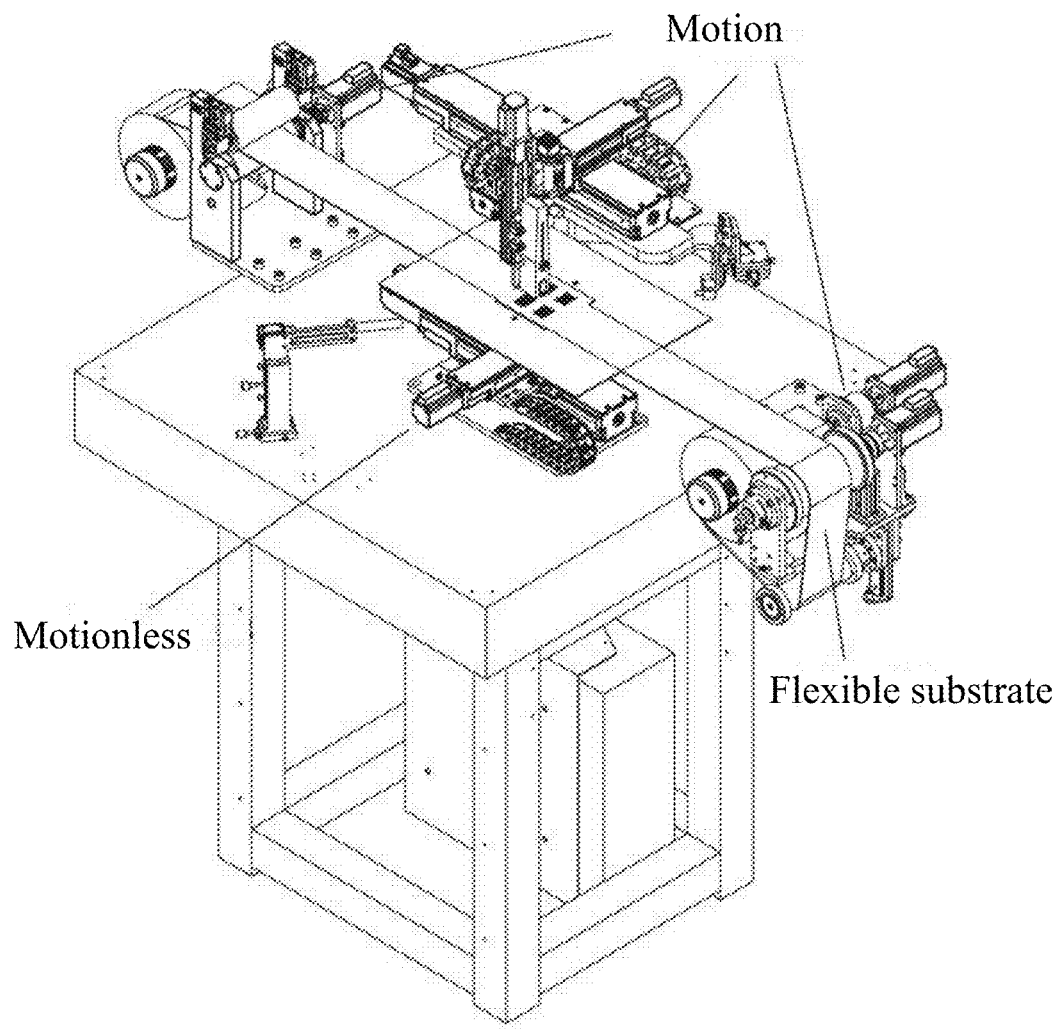
FIG. 19 illustrates movement of all parts of a multifunctional electrohydrodynamic jet printing device operating in another mode.

The roll-to-roll thin film conveying module 400 and the jet printing module 500 work together, and print patterns on the flexible substrate. In this mode, the roll-to-roll thin film conveying module 400 transfers a substrate in a single direction, and movement for printing the patterns is done by the jet printing module 500. Firstly, the material roll installed on the unwinding roller 420 of the unwinding part of the roll-to-roll thin film conveying module 400, passes through a gap between the upper roller and the lower roller of the nip roller 430, and is disposed at the top of the adsorption platform, and wounded on the winding roller of the rear winding part (the mode and movement states are illustrated in FIG. 19). Prior to printing, the rigid substrate returns to an initial position right above the adsorption platform, and remains static (this can be calibrated by experiments). Then the jet printing module 500 stops moving, and remains static during printing. A height between the nozzle and the substrate determining the jet printing mode can be freely set according to calibration results of experiments. As printing starts, the jet printing module 500 is initialized and moves to a zero point of the device, then patterns are printed according to a printing process as shown in FIG. 17. In this case, the nozzle moves under the drive of the X-direction motion module and the Y-direction motion module of the jet printing module 500, executes instructions generated after pattern parsing, and thus forming the pattern under the control of jet printing. The roll-to-roll thin film conveying module remains static. After printing is completed, the jet printing module 500 is reset and returns to the zero point. The roll-to-roll thin film conveying module starts feed motion, transfers the flexible substrate forwardly, and repeats the printing process until a new print region moves to the adsorption platform. This kind of operation is suitable for printing of large-area components, such as piezoelectric thin films, solar film batteries, functional composite materials and so on.

Figure 21:
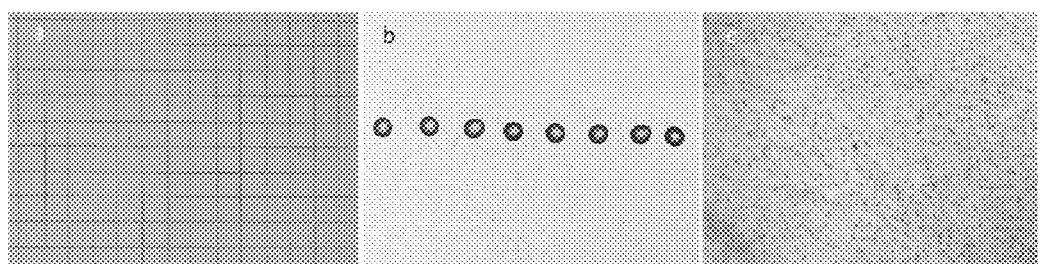
FIG. 21 is a schematic diagram of a silicon-based nozzle array layer of a multifunctional electrohydrodynamic jet printing device of the invention.

As shown in FIG. 21, three typical patterns: (a) a fiber array; (b) a single droplet array; and (c) a liquid film under three printing modes;

By using the printing mode of the invention, it is possible to obtain multiple retractable structures. Two typical flexible and stretchable ripple structures are described hereinafter.

Example 3

Figure 22A:
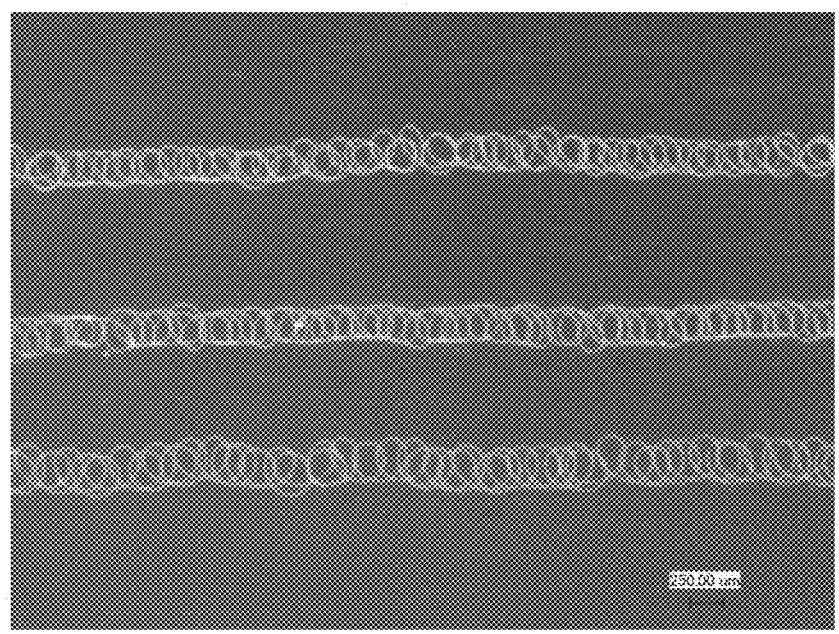
FIGS. 22A, 22B and 22C illustrate a buckling ripple structure directly printed by a multifunctional electrohydrodynamic jet printing device of an exemplary embodiment of the invention.
Figure 22B:
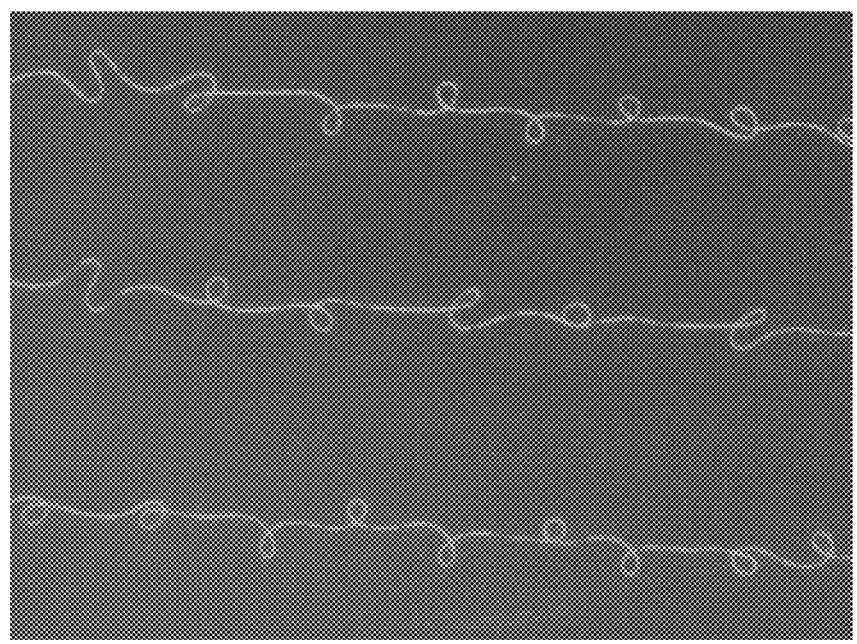
Figure 22C:
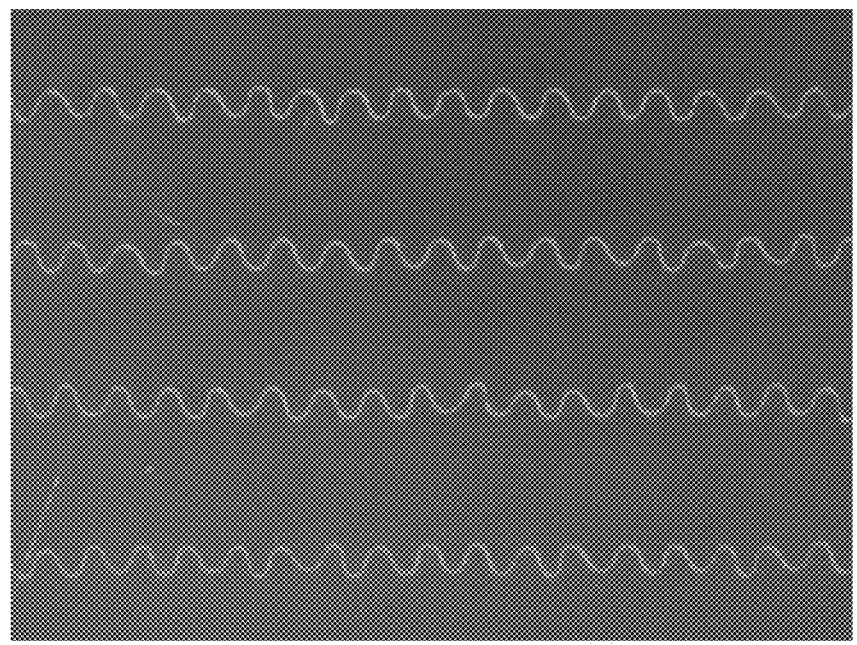

A continuous jet printing mode is used, the jet printing module 500 and the substrate bearing and moving module 600 work together, and print patterns on a sheet-shaped substrate. Firstly, the substrate bearing and moving module 600 is initialized, and the X-axis motion module 602 and the Y-axis motion module 604 are adjusted so that the slider moves to the center of a motion displacement thereof. Then an elastic PDMS substrate is placed at the center of the adsorption platform, and the vacuum pump is enabled by a control module, at this time negative pressure is formed at the surface of the vacuum adsorption platform, and the substrate is tightly absorbed on the adsorption platform. After that, movement of three motion modules of the jet printing module 500 is adjusted thereby enabling the nozzle to align with an edge of the substrate, namely a zero point of the printing apparatus. Finally a height between the nozzle and the substrate is adjusted thereby forming jet whipping. As shown in FIGS. 22A, 22B and 22C, different velocities of the substrate forms different ripple structures. For example, as a velocity of the substrate is 50 mm/s, an overlapping ripple structure is obtained; as a velocity of the substrate is 100 mm/s, an 8-shaped ripple structure is obtained; as a velocity of the substrate is 200 mm/s, a sinusoidal ripple structure is obtained.

Example 4

Figure 23A:
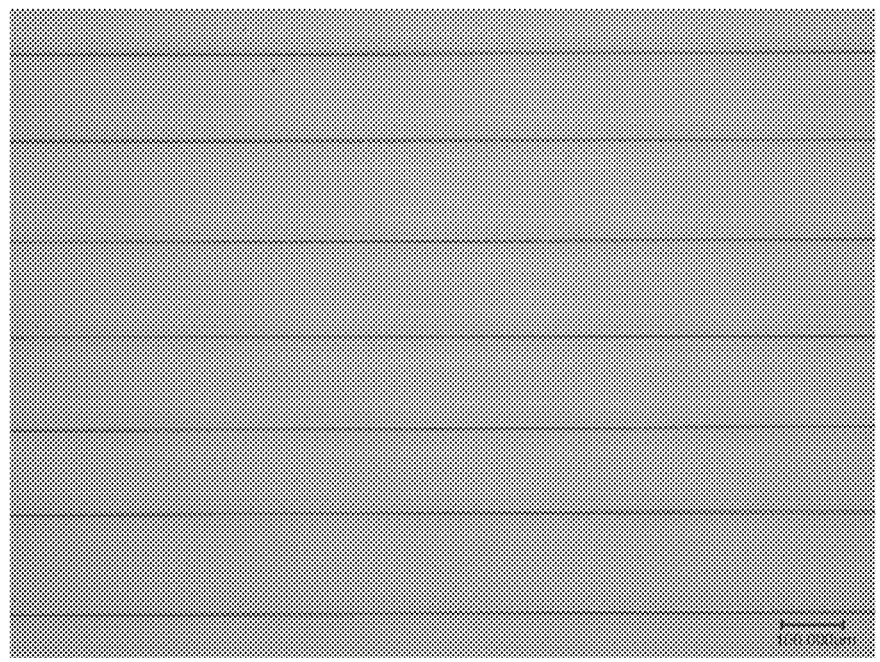
FIGS. 23A and 23B illustrate another buckling ripple structure directly printed by a multifunctional electrohydrodynamic jet printing device of an exemplary embodiment of the invention after linear strain.
Figure 23B:
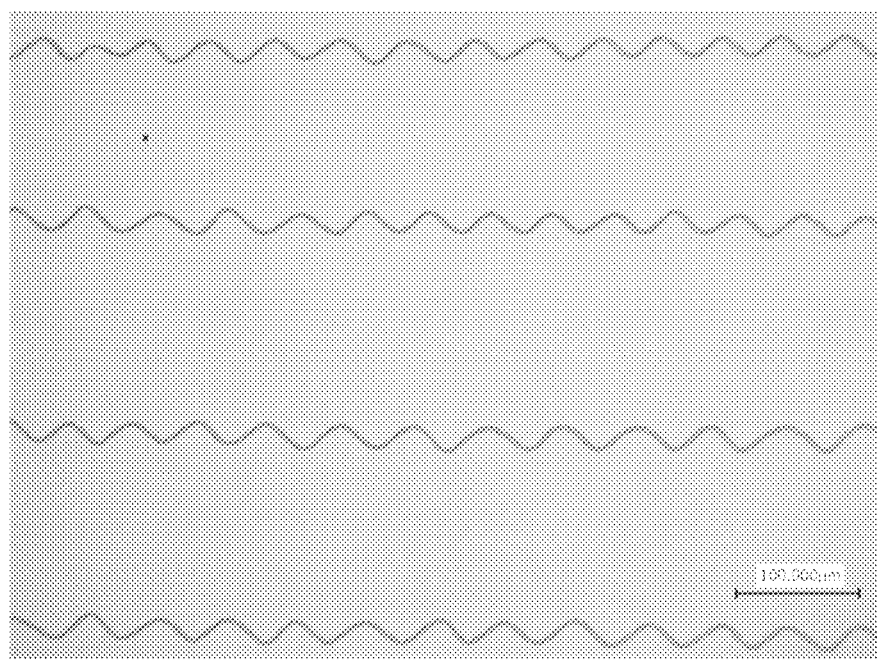

A continuous jet printing mode is used, the jet printing module 500 and the substrate bearing and moving module 600 work together, and print patterns on a sheet-shaped substrate. Firstly, the substrate bearing and moving module 600 is initialized, and the X-axis motion module 602 and the Y-axis motion module 604 are adjusted so that the slider moves to the center of a motion displacement thereof. Then an elastic PDMS substrate is placed at the center of the adsorption platform, and the vacuum pump is enabled by a control module, at this time negative pressure is formed at the surface of the vacuum adsorption platform, and the substrate is tightly absorbed on the adsorption platform. After that, movement of three motion modules of the jet printing module 500 is adjusted thereby enabling the nozzle to align with an edge of the substrate, namely a zero point of the printing apparatus. After that, a straight line is printed on the elastic PDMS substrate, and the substrate is released after printing is completed. Finally, a sinusoidal ripple structure is obtained, as shown in FIGS. 23A and 22B.

Figure 24:
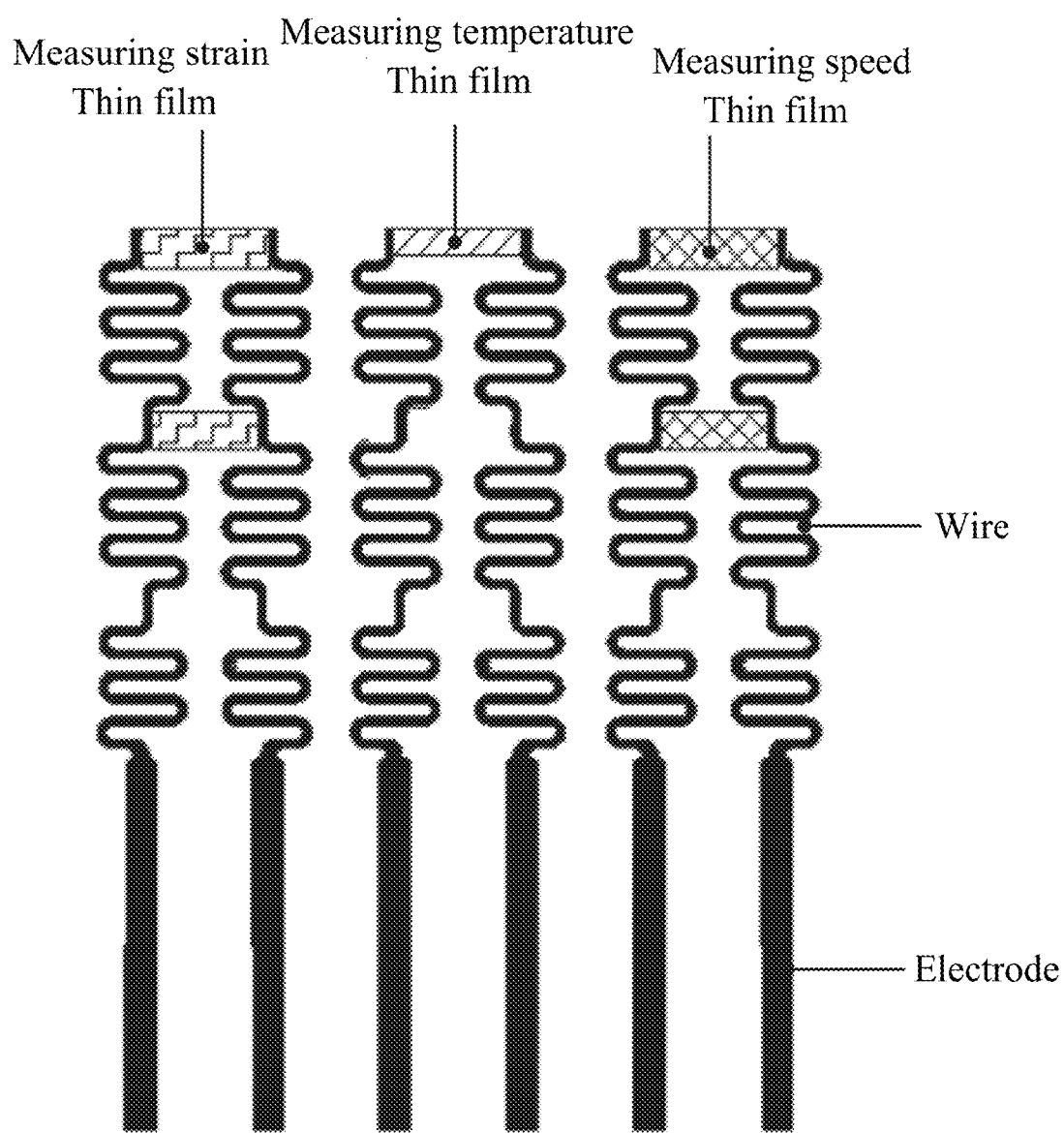
FIG. 24 is a schematic diagram of a multifunctional sensor of a multifunctional electrohydrodynamic jet printing device of an exemplary embodiment of the invention.

By using the above-mentioned combinations of motion, as well as special printing modes explained with reference to FIG. 1, it is possible to generate multiple patterns. By using these three jet printing modes, a multifunctional sensor as shown in FIG. 24 can be printed, and this sensor can operate as a strain, temperature and velocity sensor of a moving flexible surface. The sensor mainly comprises three parts: an electrode, a wire and a functional film (a strain measurement film, a temperature measurement film, and a velocity measurement film). The electrode is obtained by repeatedly on-demand point injection via copper ink, the wire is obtained by electrospinning via ink mixing silver particles with conducting polymer, and the functional film is obtained by mist spraying via different functional materials.

While preferred embodiments of the invention have been described above, the invention is not limited to disclosure in the embodiments and the accompanying drawings. Any changes or modifications without departing from the spirit of the invention fall within the scope of the invention.

The invention claimed is:

1. An electrohydrodynamic inkjet printing device, comprising:
   (1) a support part;
   (2) a jet printing module, the jet printing module being disposed on the support part and comprising a nozzle assembly for ejecting printing fluid onto a substrate for pattern printing;
   (3) a substrate bearing and moving module, the substrate bearing and moving module being disposed on the support part, and operating to fixedly bear a rigid substrate as the substrate for pattern printing, and to drive the rigid substrate to move with respect to the jet printing module thereby enabling pattern printing on the rigid substrate; and
   (4) a roll-to-roll thin film conveying module, the roll-to-roll thin film conveying module being disposed on the support part, and operating to transfer a flexible film as the substrate for pattern printing, and to drive the flexible film to move with respect to the jet printing module thereby enabling pattern printing on the flexible film;
   wherein:
   the roll-to-roll thin film conveying module comprises an unwinding part adapted to release the flexible film, and a winding part;
   the unwinding part comprises an unwinding plate, and an unwinding roller and a nip roller are disposed on the unwinding plate;
   the unwinding roller is adapted to release the flexible film, and the nip roller is adapted to receive and output the flexible film released by the unwinding roller;
   the winding part comprises a winding plate, and an adsorption roller, a dance roller and a winding roller disposed on the winding plate;
   the adsorption roller is adapted to adsorb and press the flexible film transferred from the unwinding part, the winding roller is adapted for film collecting, and the dance roller is disposed between the adsorption roller and the winding roller and is adapted to stretch the flexible film;
   the unwinding roller comprises a magnetic particle brake connection plate, a magnetic particle brake, a coupling, a bearing support, an inflatable shaft, and a material roll;
   the magnetic particle brake connection plate is fixed on the unwinding plate, one side thereof is fixedly connected to an end of the magnetic particle brake connection plate, the magnetic particle brake is received in a connecting hole of the coupling;
   an optical axis of the inflatable shaft passes through a bearing hole in the bearing support fixed on the unwinding plate, and is connected to one end of the coupling;
   the material roll in a tension state is wound on an expansion end of the inflatable shaft, and is adapted to output the flexible film in synchronous rotation with the inflatable shaft under the drive thereof;
   the winding roller comprises a winding roller motor supported by a roller motor support part disposed on the winding plate;
   a motor shaft of the winding roller motor is connected to an end of a clutch;
   an optical axis of the inflatable shaft passes through the bearing hole in the bearing support fixed on the winding plate, and is received in one hole on the other end of the coupling;
   the winding roller is fit on the inflatable shaft, and is adapted to collect the flexible film under the drive of the winding roller motor;
   the winding roller further comprises:
   a clutch support plate fixed on the winding plate and adapted to receive a magnetic powder clutch thereby ensuring that winding tension is constant during winding; and
   a second coupling, the motor shaft of the winding roller motor passing through the second coupling and being flexibly connected to one end of the magnetic powder clutch, and the other end of the magnetic powder clutch being connected to an end of the clutch;
   the nozzle assembly is movable with respect to the substrate for pattern printing in three orthogonal directions;
   the nozzle assembly comprises a plurality of nozzles for ejecting the printing fluid; and
   each of the plurality of nozzles comprises an electrode such that a high-voltage electrostatic field is applicable between the nozzle assembly and the substrate for pattern printing.

2. The device of claim 1, wherein the jet printing module comprises:
   a base fixed on the support part;
   a first first-directional motion module fixed on the base, and adapted to move in a first direction with respect to the base;

a first second-directional motion module disposed on the first first-directional motion module via a first directional connecting plate on the first first-directional motion module, and adapted to move in a second direction with respect to the first first-directional motion module; and a third-directional motion module disposed on the first second-directional motion module via a second directional connecting plate on the first second-directional motion module, and adapted to move in a third direction with respect to the first second-directional motion module, an injection pump and the nozzle assembly being disposed thereon.

3. The device of claim 1, wherein the substrate bearing and moving module comprises:

a substrate base fixed on the support part;

a second first-directional motion module fixed on the substrate base, and adapted to move in a first direction with respect thereto;

a second second-directional motion module disposed on the second first-directional motion module via a movable connecting plate fixed on the second first-directional motion module, and adapted to move in a second direction with respect to the second first-directional motion module; and an adsorption platform disposed on the second second-directional motion module via a slider connecting plate fixed on the second second-directional motion module, adapted to move synchronously therewith, and operating to adsorb the rigid substrate as the substrate for pattern printing.

4. The device of claim 1, wherein:

the nip roller comprises an upper roller and a lower roller parallel to each other;

an end of the upper roller and that of the lower roller are supported by a pair of nip roller support plates symmetrically and vertically fixed on the unwinding plate;

the upper end of the nip roller support plates is adapted to receive a cylinder;

the upper roller operates to adjust the gap between the upper roller and the lower roller; and one end of the lower roller is connected to a rotating shaft of a motor, and the motor drives the lower roller to rotate thereby outputting the flexible film between the upper roller and the lower roller.

5. The device of claim 1, wherein the jet printing device further comprises a print observation module comprising an observation part and a lighting part disposed on an end of the jet printing module opposite thereto;

the observation part comprises a first adjustable sliding table, a connecting board, a second adjustable sliding table, a camera and a lens;

the first adjustable sliding table is fixedly disposed on the support part;

a bottom of the connecting board is connected to the first adjustable sliding table, and one side thereof is connected to the second adjustable sliding table;

the camera is fixed at the top of the second adjustable sliding table;

the lens is connected to the camera via screws;

the lighting part comprises a light source, a light source clamping device, an adapter plate, a height variation sliding table, a first support plate, a single-axis horizontal sliding table, and a second support plate;

the single-axis horizontal sliding table is fixed on one end of the second support plate, and the other end of the second support plate is fixed on the base;

the first support plate is L-shaped, the bottom thereof is connected to the single-axis horizontal sliding table, and one side thereof is connected to the height variation sliding table;

a slider of the height variation sliding table is connected to one end of the adapter plate, and the other end of a second adapter plate is connected to the light source clamping device; and the light source is connected to the light source clamping device.

6. The device of claim 1, wherein the jet printing device further comprises a shell box disposed on the support part and covering the jet printing module, the substrate bearing and moving module and the roll-to-roll thin film conveying module;

the shell box comprises a lower temperature control box, an upper temperature control box, a freezer and a heater;

the lower temperature control box is fixed on the support part, and operates to isolate heat from the substrate bearing and moving module;

the upper temperature control box is vertically disposed on the lower temperature control box, a separating plate operating to separate the upper temperature control box from the lower temperature control box is disposed between these two temperature control boxes, thereby forming a temperature control cavity of a print area; and the freezer and the heater are respectively disposed on the top and one side of the upper temperature control box, and operate to control temperature therein.

7. The device of claim 1, wherein the nozzle assembly of the jet printing module comprises an upper layer and a lower layer connected by bonding;

the upper layer is a PDMS layer, and the lower layer is a silicon-based nozzle array layer;

the PDMS layer operates to provide an inlet for external solution, and comprises a channel allowing the printing fluid to flow towards the lower layer;

the silicon-based nozzle array layer integrates multiple nozzles each having an electrode; and a high-voltage electrostatic field applied between the lower layer and the substrate for pattern printing allows the printing fluid at the nozzle lower layer to eject in the form of jet flow.

8. The device of claim 1, wherein the dance roller comprises:

a roller mounting plate vertically connected to the winding plate via an angle brace; and an idler roller and a frictional cylinder driving the idler roller to move, the idler roller being connected to the roller mounting plate via an adapter plate, the idler roller comprising a flange base connected to the adapter plate, an idler roller axis disposed on the flange base, and an idler roller wheel fit on the idler roller axis, two ends of the roller wheel being fit with bearing pipes and encapsulated by bearing covers.

9. The device of claim 8, wherein the adsorption roller comprises an adsorption roller axis, a sleeve fit on the adsorption roller axis, an adsorption roller motor connected to an end of the adsorption roller axis;

the adsorption roller axis is a step-shaped core shaft, an axial keyway is disposed on the shaft, and a baffle is disposed in the keyway and between the adsorption roller axis and the sleeve;

an end of the adsorption roller axis opposite to the adsorption roller motor is fixed on a support plate via a shaft bearing, both ends thereof are closed by end covers of the adsorption roller thereby forming an enclosed space; and adsorption and feeding of the flexible film is achieved by forming vacuum in the enclosed space, adsorbing the flexible film on surface of the sleeve via holes on the sleeve and forcing the sleeve to rotate using the adsorption roller motor.

10. The device of claim 9, wherein the jet printing device further comprises a print observation module comprising an observation part and a lighting part disposed on an end of the jet printing module opposite thereto;

the observation part comprises a first adjustable sliding table, a connecting board, a second adjustable sliding table, a camera and a lens;

the first adjustable sliding table is fixedly disposed on the support part;

a bottom of the connecting board is connected to the first adjustable sliding table, and one side thereof is connected to the second adjustable sliding table;

the camera is fixed at the top of the second adjustable sliding table;

the lens is connected to the camera via screws;

the lighting part comprises a light source, a light source clamping device, an adapter plate, a height variation sliding table, a first support plate, a single-axis horizontal sliding table, and a second support plate;

the single-axis horizontal sliding table is fixed on one end of the second support plate, and the other end of the second support plate is fixed on the base;

the first support plate is L-shaped, the bottom thereof is connected to the single-axis horizontal sliding table, and one side thereof is connected to the height variation sliding table;

a slider of the height variation sliding table is connected to one end of the adapter plate, and the other end of a second adapter plate is connected to the light source clamping device; and the light source is connected to the light source clamping device.

11. The device of claim 10, wherein the jet printing device further comprises a shell box disposed on the support part and covering the jet printing module, the substrate bearing and moving module and the roll-to-roll thin film conveying module;

the shell box comprises a lower temperature control box, an upper temperature control box, a freezer and a heater;

the lower temperature control box is fixed on the support part, and operates to isolate heat from the substrate bearing and moving module;

the upper temperature control box is vertically disposed on the lower temperature control box, a separating plate operating to separate the upper temperature control box from the lower temperature control box is disposed between these two temperature control boxes, thereby forming a temperature control cavity of a print area; and the freezer and the heater are respectively disposed on the top and one side of the upper temperature control box, and operate to control temperature therein.

12. The device of claim 11, wherein the nozzle assembly of the jet printing module comprises an upper layer and a lower layer connected by bonding;

the upper layer is a PDMS layer, and the lower layer is a silicon-based nozzle array layer;

the PDMS layer operates to provide an inlet for external solution, and comprises a channel allowing the printing fluid to flow towards the lower layer;

the silicon-based nozzle array layer integrates multiple nozzles each having an electrode; and a high-voltage electrostatic field applied between the lower layer and the substrate for pattern printing allows the printing fluid at the lower layer to eject in the form of jet flow.

* * * * *